US012206964B2

(12) United States Patent
Wei et al.

(10) Patent No.: US 12,206,964 B2
(45) Date of Patent: Jan. 21, 2025

(54) TOF CAMERA MODULE AND PROJECTION MODULE THEREOF, AND ELECTRONIC DEVICE

(71) Applicant: NINGBO SUNNY OPOTECH CO., LTD., Zhejiang (CN)

(72) Inventors: Hangang Wei, Zhejiang (CN); Feifan Chen, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 293 days.

(21) Appl. No.: 17/638,390

(22) PCT Filed: Jul. 1, 2020

(86) PCT No.: PCT/CN2020/099728
§ 371 (c)(1),
(2) Date: Feb. 25, 2022

(87) PCT Pub. No.: WO2021/036498
PCT Pub. Date: Mar. 4, 2021

(65) Prior Publication Data
US 2022/0303443 A1 Sep. 22, 2022

(30) Foreign Application Priority Data

Aug. 28, 2019 (CN) .......................... 201910800626.3
Aug. 28, 2019 (CN) .......................... 201921414693.3

(51) Int. Cl.
*H04N 23/52* (2023.01)
*G01S 17/894* (2020.01)
(Continued)

(52) U.S. Cl.
CPC ........... *H04N 23/52* (2023.01); *G01S 17/894* (2020.01); *H04N 23/51* (2023.01); *H04N 23/55* (2023.01);
(Continued)

(58) Field of Classification Search
CPC ........ H04N 23/51; H04N 23/52; H04N 23/55; H04N 23/56; H04N 23/57; G01S 17/894;
(Continued)

(56) References Cited

U.S. PATENT DOCUMENTS 9,544,951 B1 * 1/2017 O'Neil ................. H05B 45/382
2011/0069221 A1 * 3/2011 Yee ........................ H04N 23/54
356/399
(Continued)

FOREIGN PATENT DOCUMENTS

CN 104994259 10/2015
CN 105992960 10/2016
(Continued)

OTHER PUBLICATIONS

International Search Report issued Sep. 16, 2020, in International (PCT) Application No. PCT/CN2020/099728, with English translation.
(Continued)

*Primary Examiner* — Timothy R Newlin
(74) *Attorney, Agent, or Firm* — Wenderoth, Lind & Ponack, L.L.P.

(57) ABSTRACT

The present invention provides a TOF camera module and a projection module thereof, and an electronic device, wherein the TOF camera module comprises a projection module and a receiving module, wherein the projection unit of the projection module is controlled by the driver chip to project detection light, and wherein the receiving module is disposed adjacent to the projection module, the receiving module receives reflected light of the detection light, and obtains depth information of an illuminated object based on the reflected light. The projection module comprises a transmitting circuit board, a support, an optical element, at least one projection unit and at least one driver chip, wherein
(Continued)

the driver chip is conductively connected to the transmitting circuit board, and the driver chip controls the projection unit through the transmitting circuit board, and wherein the driver chip and the projection unit are located on the same side of the transmitting circuit board.

18 Claims, 22 Drawing Sheets

(51) Int. Cl.
*H04N 23/51* (2023.01)
*H04N 23/55* (2023.01)
*H04N 23/56* (2023.01)
*H01L 27/146* (2006.01)

(52) U.S. Cl.
CPC ....... *H04N 23/56* (2023.01); *H01L 27/14618* (2013.01)

(58) Field of Classification Search
CPC ............ G01S 7/4814; H01L 27/14618; H04M 1/0272; H04M 1/0264; G03B 15/03; G03B 30/00; G03B 17/55; G06F 1/1686; G06F 1/203
See application file for complete search history.

(56) References Cited

U.S. PATENT DOCUMENTS

| | | | | |
|---|---|---|---|---|
| 2014/0327902 | A1* | 11/2014 | Giger | G01S 17/08 356/5.01 |
| 2015/0229912 | A1* | 8/2015 | Masalkar | H04N 13/254 348/46 |
| 2018/0035531 | A1* | 2/2018 | Nalla | H05K 3/4697 |
| 2018/0069388 | A1* | 3/2018 | Kim | H02H 7/18 |
| 2018/0278011 | A1* | 9/2018 | Galvano | G01S 7/4813 |
| 2019/0067901 | A1* | 2/2019 | Khassine | H01S 5/0201 |
| 2021/0075186 | A1* | 3/2021 | Zheng | H01S 5/02325 |
| 2021/0257815 | A1* | 8/2021 | Liu | G01S 17/08 |

FOREIGN PATENT DOCUMENTS

| | | |
|---|---|---|
| CN | 109151271 | 1/2019 |
| CN | 109714515 | 5/2019 |
| CN | 109737868 | 5/2019 |
| CN | 109756654 | 6/2019 |
| CN | 110012198 | 7/2019 |
| CN | 209283349 | 8/2019 |
| WO | 2015/119979 | 8/2015 |

OTHER PUBLICATIONS

Extended European Search Report dated Jan. 18, 2023, in corresponding European application No. 20857458.2.

* cited by examiner

TOF CAMERA MODULE AND PROJECTION MODULE THEREOF, AND ELECTRONIC DEVICE

TECHNICAL FIELD

The present invention relates to the technical field of camera modules, and in particular to a TOF camera module and a projection module thereof, and an electronic device.

BACKGROUND

With the gradual improvement of biometric technology, such as face recognition technology, it is being widely used in various mobile terminals (mobile phones, tablet computers) to realize the development of various applications based on biometrics, such as password unlocking, quick payment, etc. In the face recognition technology, a depth information camera module based on Time of Flight (TOF), namely, a TOF camera module, is one of the more popular products.

The TOF camera module refers to that a sensor is used to emit modulated light, and after it is reflected by an object, the sensor calculates a time difference or phase difference between the emitted light and the light reflected from the object to obtain depth information about the object. The existing TOF camera module generally includes a projection module, a receiving module and a circuit board, wherein the projection module and the receiving module are separately directly mounted and electrically connected to the circuit board.

Since the current demand for electronic devices, such as smart phones, tablet computers, etc., is the development trend of thinness and full screen, and the design of camera modules also tends to be miniaturized. The TOF camera module in the prior art also has at least one of the following defects: first, the projection light signal projected by the projection module of the TOF camera module has a poor waveform. The main reason that affects the waveform of the projection light signal projected by the projection module is the wiring distance between the driver chip and the projection unit of the projection module. If the wiring distance between the driver chip and the projection unit is longer, the driver chip controls the pulse wave projected by the projection unit to be shaped like a mountain peak.

Due to the large size of the driver chip itself, the driver chip of the TOF camera module in the prior art is disposed on the receiving module or stacked below the projection module, so as to reduce the dimensions of the TOF camera module in the X and Y directions (length and width). However, the wiring distance between the driver chip and the projection unit of the existing TOF camera module is relatively long, resulting in poor waveform of the projection light signal. Secondly, when the electronic device is assembled, the TOF camera module is usually stacked above the circuit board of the electronic device in a manner of welding/soldering, and since the driver chip is usually stacked on the back of the projection module, the thickness of the TOF camera module in the prior art cannot be further reduced, which is disadvantageous to the lightening and thinning of electronic devices. On the other hand, the heat dissipation performance of the TOF camera module in the prior art is poor, and the high temperature of the projection module of the TOF camera module will affect the optical power of the projection unit, or affect the service life of the TOF camera module.

The transmitting end and the receiving end of the TOF camera module in the prior art are assembled into one body and then assembled to the mainboard of the electronic device, wherein the transmitting end of the TOF camera module cannot be used independently to emit a light signal of a specific waveform. This is because the transmitting end of the TOF camera module in the prior art is controlled by the receiving end, and the light signal of the preset waveform is emitted, that is, the driver chip that controls the transmitting end is packaged in the receiving end. The transmitting end of the TOF camera module in the prior art is not a module that can exist and work independently, that is, the transmitting end in the prior art needs to work under the control of the receiving end. Therefore, the transmitting end of the TOF camera module in the prior art cannot exist independently.

SUMMARY

One of the main advantages of the present invention is to provide a TOF camera module and a projection module thereof, and an electronic device, wherein by reducing a wiring distance between a driver chip and a projection unit of a projection module of the TOF camera module, the parasitic inductance of the projection module is reduced, the pulse waveform quality of the light signal projected by the projection unit is improved, and the signal-to-noise ratio is improved.

Another advantage of the present invention is to provide a transmitting end module with complete functions. The transmitting end module comprises a driver IC packaged inside. The bottom of the transmitting end module has solder joints, and can be directly conducted and connected to the terminal mainboard through the bottom solder joints, that is, the transmitting end module can work independently of the receiving end module.

Another advantage of the present invention is to provide a TOF camera module and a projection module thereof, and an electronic device, wherein a driver chip and projection unit of the projection module are attached to the same side of a circuit board of the projection module, which is advantageous to shorten the wiring distance between the driver chip and the projection unit.

Another advantage of the present invention is to provide a TOF camera module and a projection module thereof, and an electronic device, wherein the circuit board of the projection module is a ceramic substrate, which is advantageous to improve the heat dissipation of the projection module.

Another advantage of the present invention is to provide a TOF camera module and a projection module thereof, and an electronic device, wherein a support of the projection module is a heat dissipation support, so as to improve the heat dissipation of the projection module through the support.

Another advantage of the present invention is to provide a TOF camera module and a projection module thereof, and an electronic device, wherein the support of the projection module is integrally molded on the circuit board, and the driver chip and some other electronic elements are wrapped by the support, so as to reduce the X and Y (length and width) dimensions of the projection module.

Another advantage of the present invention is to provide a TOF camera module and a projection module thereof, and an electronic device, wherein the support of the projection module is integrally molded on the circuit board, which is advantageous to improve the reliability and overall strength of the projection module.

Another advantage of the present invention is to provide a TOF camera module and a projection module thereof, and an electronic device, wherein the support of the projection module is integrally molded on the circuit board, thereby reducing the manufacturing process of the projection module, and improving the production efficiency.

Another advantage of the present invention is to provide a TOF camera module and a projection module thereof, and an electronic device, wherein the support of the projection module is integrally molded on the circuit board, and the driver chip is wrapped by the support, so that the support protects the driver chip.

Another advantage of the present invention is to provide a TOF camera module and a projection module thereof, and an electronic device, wherein the support of the projection module is integrally molded on the circuit board and the driver chip is wrapped by the support, and wherein the support conducts the heat generated by the driver chip to improve the heat dissipation performance of the projection module.

Another advantage of the present invention is to provide a TOF camera module and a projection module thereof, and an electronic device, wherein the projection module and the receiving module of the TOF camera module can be independently disposed on the mainboard of the electronic device, and the TOF camera module can be assembled based on the design requirements of the electronic device, which is advantageous to improve the use performance of the TOF camera module.

Another advantage of the present invention is to provide a TOF camera module and a projection module thereof, and an electronic device, wherein the driver chip of the projection module and the projection unit are disposed on the same side, to reduce the overall thickness of the projection module, which is advantageous to the lightening and thinning of the electronic device.

Another advantage of the present invention is to provide a TOF camera module and a projection module thereof, and an electronic device, wherein the mainboard of the electronic device is provided with a mounting groove (hole or half hole) corresponding to the TOF camera module, and the receiving module of the TOF camera module is correspondingly embedded in the mounting groove (hole or half hole) of the mainboard, which is advantageous to reduce the overall thickness of the electronic device. Other advantages and features of the present invention will be fully embodied from the following detailed description and can be realized through the combinations of means and apparatuses particularly pointed out in the appended claims.

According to one aspect of the present invention, a projection module of the present invention capable of achieving the foregoing and other objectives and advantages comprises:
  a transmitting circuit board;
  a support, wherein the support is disposed on the transmitting circuit board; an optical element, wherein the optical element is attached to the support, and an accommodating space is formed above the transmitting circuit board by means of the optical element and the support;
  at least one projection unit, wherein the projection unit is disposed in the accommodating space, and the projection unit is conductively attached to the transmitting circuit board; and at least one driver chip, wherein the driver chip is conductively connected to the transmitting circuit board, and the driver chip controls the projection unit through the transmitting circuit board, and wherein the driver chip and the projection unit are located on the same side of the transmitting circuit board.

According to an embodiment of the present invention, the transmitting circuit board has an upper end surface and a lower end surface, wherein the driver chip is attached to the upper end surface of the transmitting circuit board in a manner adjacent to the projection unit.

According to an embodiment of the present invention, the projection module further comprises a connection layer, and the support is connected to the upper end surface of the transmitting circuit board by means of the connection layer.

According to an embodiment of the present invention, the connection layer is selected from a connection layer group consisting of an adhesive layer or a solder layer.

According to an embodiment of the present invention, the support contacts the driver chip in a thermally conductive manner, and heat generated by the driver chip is conducted by means of the support.

According to an embodiment of the present invention, the support has an accommodating cavity, the driver chip is disposed in the accommodating cavity, and the support covers the upper surface of the driver chip in a thermal contact manner.

According to an embodiment of the present invention, the support is selected from a group consisting of a ceramic sintered support and a molded support.

According to an embodiment of the present invention, the support is integrally formed on the upper end surface of the transmitting circuit board through a molding process.

According to an embodiment of the present invention, the driver chip is covered by the support, and heat generated by the driver chip is conducted by means of the support.

According to an embodiment of the present invention, the transmitting circuit board comprises:
  a transmitting circuit substrate;
  a plurality of upper solder joints, wherein the upper solder joints are disposed on an upper end of the transmitting circuit substrate;
  a plurality of lower solder joints, wherein the lower solder joints are disposed on a lower end of the transmitting circuit substrate; and
  a plurality of conduction circuits, wherein the conduction circuits electrically connect the upper solder joints and the lower solder joints, and wherein the driver chip is conductively connected to the conduction circuits through the upper solder joints, and the lower solder joints are electrically connected to the upper solder joints through the conduction circuits.

According to an embodiment of the present invention, the projection module further comprises a flexible board and a connector, wherein the lower solder joints of the transmitting circuit board are conductively connected to the flexible board, and the flexible board is conductively connected to the connector through the flexible board.

According to an embodiment of the present invention, the projection module further comprises a flexible board, and wherein one end of the flexible board is conductively connected to the transmitting circuit board.

According to an embodiment of the present invention, the support comprises a support body and is further provided with a mounting groove and at least one air escape groove, wherein the mounting groove is formed at an upper end of the support body, the optical element is disposed in the mounting groove, the air escape groove communicates the accommodating space with an external environment, and air pressure is balanced between the accommodating space and the external environment by means of the air escape groove.

According to an embodiment of the present invention, the support comprises a support body and is further provided with at least one glue painting area, and between the glue painting area and the optical element, a cured glue layer is formed by curing glue, and an air escape gap is formed at an interval, wherein the air escape gap communicates the accommodating space with an external environment, and air pressure is balanced between the accommodating space and the external environment by means of the air escape gap.

According to an embodiment of the present invention, the projection module further comprises at least one electrical element, wherein the electrical element is conductively connected to the transmitting circuit board.

According to an embodiment of the present invention, the electrical element comprises a photodiode for monitoring light changes in the projection module, and the photodiode is conductively connected to the driver chip, for the driver chip to control a working state of the projection unit based on detection information of the photodiode.

According to an embodiment of the present invention, the electrical element comprises a negative temperature coefficient device for monitoring a temperature of the projection unit, and the negative temperature coefficient device is conductively connected to the driver chip through the transmitting circuit board.

According to an embodiment of the present invention, the transmitting circuit substrate of the transmitting circuit board is selected from a ceramic substrate and a PCB board.

According to another aspect of the present invention, the present invention further provides a TOF camera module, comprising:

any one of the projection modules as described above, wherein the projection unit of the projection module is controlled by the driver chip to project detection light; and a receiving module, wherein the receiving module is disposed adjacent to the projection module, and the receiving module receives reflected light of the detection light, and obtains depth information of an illuminated object based on the reflected light.

According to an embodiment of the present invention, the projection module and the receiving module are disposed independently of each other.

According to an embodiment of the present invention, the TOF camera module comprises a lens assembly, a photosensitive element, and at least one receiving circuit board, wherein the photosensitive element is attached to the receiving circuit board, and the lens assembly is disposed above the receiving circuit board based on a photosensitive path of the photosensitive element.

According to an embodiment of the present invention, the receiving circuit board comprises a circuit board receiving end and a circuit board transmitting end integrally extending from the circuit board receiving end, wherein the projection module is disposed above the circuit board transmitting end of the receiving circuit board, and the transmitting circuit board of the projection module is conductively connected to the receiving circuit board.

According to an embodiment of the present invention, the TOF camera module further comprises at least one flexible board, wherein the flexible board conductively connects the transmitting circuit board of the projection module to the circuit board transmitting end of the receiving circuit board.

According to an embodiment of the present invention, the TOF camera module further comprises at least one base support, wherein the base support is stacked on the circuit board transmitting end of the receiving circuit board, the projection module is supported above the base support, and a height of the projection module is raised by means of the base support.

According to an embodiment of the present invention, the TOF camera module further comprises at least one electronic element unit, and the electronic element unit is disposed at the circuit board transmitting end, wherein the base support is integrally molded on the circuit board transmitting end, and the electronic element unit is wrapped by means of the base support.

According to an embodiment of the present invention, the TOF camera module further comprises at least one electronic element unit, the electronic element unit is disposed at the circuit board transmitting end, and the base support comprises a base support body and is further provided with at least one accommodating groove, wherein the accommodating groove is formed at a lower end of the base support body, the base support body is attached above the circuit board transmitting end, and the electronic element unit is wrapped by means of the base support.

According to an embodiment of the present invention, the TOF camera module further comprises at least one base support, wherein the base support is conductively disposed on the circuit board transmitting end of the receiving circuit board, the projection module is stacked above the base support, and a height of the projection module is raised by means of the base support.

According to an embodiment of the present invention, the base support comprises a base support body and at least one support conduction circuit disposed on the base support body, wherein the support conduction circuit electrically connects the transmitting circuit board of the projection module to the circuit board receiving end.

According to an embodiment of the present invention, the transmitting circuit board of the projection module is integrally molded on the circuit board receiving end of the receiving circuit board, and a height of the projection module is raised by means of the base support.

According to an embodiment of the present invention, the base support is selected from a group consisting of a ceramic support formed by sintering ceramics and a molded support composed of a molded base integrally formed by molding.

According to an embodiment of the present invention, the TOF camera module further comprises at least one fixing frame, wherein the receiving module is disposed on the fixing frame in a manner that the optical axis can be adjusted, and the receiving module is fixed by means of the fixing frame.

According to an embodiment of the present invention, the fixing frame comprises a receiving end fix holder and a transmitting end fix holder, wherein the receiving module is disposed on the receiving end fix holder, the projection module is disposed on the transmitting end fix holder, and a distance between the projection module and the receiving module is maintained by means of the fixing frame.

According to another aspect of the present invention, the present invention further provides an electronic device, comprising:

an electronic device host;

an electronic device mainboard, wherein the electronic device mainboard is disposed on the electronic device host; and at least one TOF camera module, wherein the TOF camera module is conductively disposed on the electronic equipment mainboard, and the TOF camera module comprises: any one of the projection modules as described above, wherein the projection unit of the projection module is controlled by the driver chip to project detection light; and a receiving module, wherein the receiving module is disposed adjacent to the projection module, and the receiving module receives reflected light of the detection light, and obtains depth information of an illuminated object based on the reflected light.

According to an embodiment of the present invention, the lower solder joints of the projection module conductively connect the transmitting circuit substrate to the electronic device mainboard, and fix the projection module to the electronic device mainboard.

According to an embodiment of the present invention, the projection module and the receiving module are disposed independently of each other.

According to an embodiment of the present invention, the electronic device mainboard comprises a mainboard body, and a pad area and a receiving end mounting groove disposed on the mainboard body, wherein the projection module is disposed on the pad area of the electronic device mainboard, the receiving module is disposed in the receiving end mounting groove, and the projection module and the receiving module are separately conductively connected to the mainboard body.

According to an embodiment of the present invention, the receiving module is depressed and mounted to the receiving end mounting groove from one surface of the mainboard body.

According to an embodiment of the present invention, the electronic device mainboard comprises a mainboard body, and a pad area and a receiving end mounting hole disposed on the mainboard body, wherein the projection module is attached and disposed to the pad area of the electronic device mainboard, the receiving module is disposed in the receiving end mounting hole, and the projection module and the receiving module are separately conductively connected to the mainboard body.

According to another aspect of the present invention, the present invention further provides an electronic device, comprising:

an electronic device host;
an electronic device mainboard, wherein the electronic device mainboard is disposed on the electronic device host; and
any one of the TOF camera modules as described above, wherein the TOF camera module is conductively disposed on the electronic device mainboard.

According to an embodiment of the present invention, the electronic device mainboard comprises a mainboard body, and a pad area and a receiving end mounting area disposed on the mainboard body, wherein the projection module of the TOF camera module is attached to the pad area, the receiving module is attached to the receiving end mounting area, and the receiving module is conductively connected to the mainboard body.

Further objectives and advantages of the present invention will be fully embodied through the understanding of the following description and the drawings.

These and other objectives, features and advantages of the present invention are fully embodied by the following detailed description, drawings and claims.

DETAILED DESCRIPTION OF THE EMBODIMENTS

Figure 1:
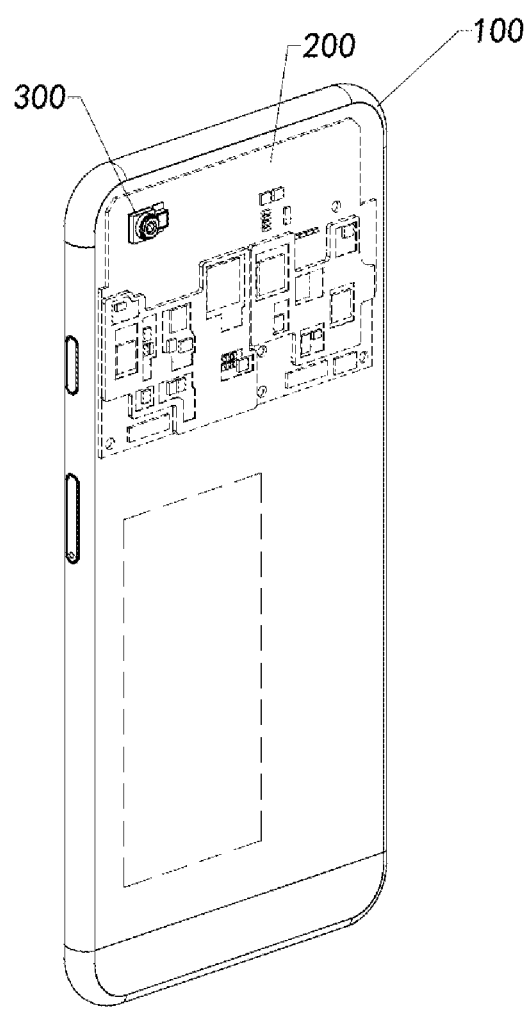
FIG. 1 is an overall schematic view of an electronic device according to a preferred embodiment of the present invention.

The following description is presented to disclose the present invention to enable those skilled in the art to practice the present invention. Preferred embodiments in the following description are by way of example only, and other obvious modifications are conceivable to those skilled in the art. The basic principles of the present invention as defined in the following description may be applied to other implementations, modifications, improvements, equivalents, and other technical solutions, without departing from the spirit and scope of the present invention.

It should be understood by those skilled in the art that in the disclosure of the present invention, the orientation or positional relationship indicated by the terms "longitudinal", "transverse", "upper", "lower", "front", "back", "left", "right", "vertical", "horizontal", "top", "bottom", "inside", "outside", etc. is based on the orientation or positional relationship shown in the drawings, which is merely for the convenience of describing the present invention and simplifying the description, and does not indicate or imply that the mentioned apparatus or element must have a particular orientation and be constructed and operated in the particular orientation. Therefore, the above terms cannot be construed as limiting the present invention.

It may be understood that the term "a" or "an" should be understood to mean "at least one" or "one or more", that is, in one embodiment, the number of an element may be one, and in other embodiments, the number of the element may be multiple. The term "a" or "an" cannot be understood as a limitation on the number.

Referring to FIG. 1 among the drawings of the present invention, an electronic device according to a preferred embodiment of the present invention is illustrated in the following description. The electronic device includes an electronic device host 100, an electronic device mainboard 200, and at least one TOF camera module 300, wherein the TOF camera module 300 is disposed on the electronic device host 100, the TOF camera module 300 is conductively connected to the electronic device mainboard 200, and the TOF camera module 300 is supported by the electronic device mainboard 200 of the electronic device to perform photographing operations. It can be understood that, the electronic device host 100 of the electronic device may also be equipped with other types of camera modules, such as a wide-angle camera module, a telephoto camera module, etc. As an example, the electronic device may be but not limited to, a smartphone, a tablet computer, or other types of apparatuses with a photographing function.

As shown in FIGS. 2A to 7F, the TOF camera module 300 of the electronic device includes a projection module 10 and a receiving module 20, wherein the receiving module emits light based on a control signal of the electronic device host 100, and wherein when the light emitted by the projection module 10 illuminates an object, the reflected light of the light is reflected by the object to the receiving module 20. Depth information about the illuminated object is obtained based on difference information such as time difference or to phase difference between the light emitted by the projection module 10 and the reflected light received by the receiving module 20.

The projection module 10 and the receiving module 20 of the TOF camera module 300 are electrically connected to the electronic device mainboard 200 of the electronic device, wherein the electronic device host 100 controls a working state of the TOF camera module 300 through the electronic device mainboard 200. It is worth mentioning that, in the preferred embodiment of the present invention, the projection module 10 and the receiving module 20 of the TOF camera module 300 can be independently mounted to the electronic device mainboard 200, that is, the projection module 10 and the receiving module 20 of the TOF camera module 300 can each be separately assembled to the electronic device mainboard 200, and the projection module 10 and the receiving module 20 are each conductively connected to the electronic device mainboard 200. It can be understood that the projection module 10 and the receiving module 20 of the TOF camera module 300 are mounted independently of each other. Therefore, the projection module 10 and the receiving module 20 of the TOF camera module 300 can be mounted based on the design requirements of the electronic device. That is to say, the projection module 10 and the receiving module 20 are separately assembled independently based on assembly requirements and design requirements, that is, the projection module 10 and the receiving module 20 are assembled on the electronic device mainboard 200 to form the TOF camera module 300, which improves the applicability of the TOF camera module 300.

In detail, the receiving module 20 includes a lens assembly 21, a photosensitive element 22, and at least one receiving circuit board 23, wherein the lens assembly 21 is disposed above the photosensitive element 22, and the photosensitive element 22 is provided with a photosensitive path by means of the lens assembly 21, so as to project external light to the photosensitive element 22 through the photosensitive path. The photosensitive element 22 converts a light signal of the external light into an electrical signal corresponding to the light signal, i.e., photoelectric conversion. The photosensitive element 22 is disposed on a surface of the receiving circuit board 23, and the photosensitive element 22 is conductively connected to the receiving circuit board 23, and by means of the receiving circuit board 23, the work of the photosensitive element 22 is supported, and a photoelectric signal of the photosensitive element 22 is received.

The lens assembly 21 includes at least one optical lens 211, a lens holder 212, a base 213 and at least one filter element 214 disposed on the base 213, wherein the optical lens 211 is supported by the lens holder 212 above the base 213 based on the photosensitive path of the receiving module 20. The light is transmitted to the filter element 214 through the optical lens 211, so that the filter element 214 filters the light, to filter out stray light that affects imaging. It can be understood by those skilled in the art that, in this preferred embodiment of the present invention, the receiving module 20 may further include other elements, such as a support for supporting and fixing the lens assembly, or an electronic component for sustaining the work of the receiving module 20 or the like.

Figure 2A:
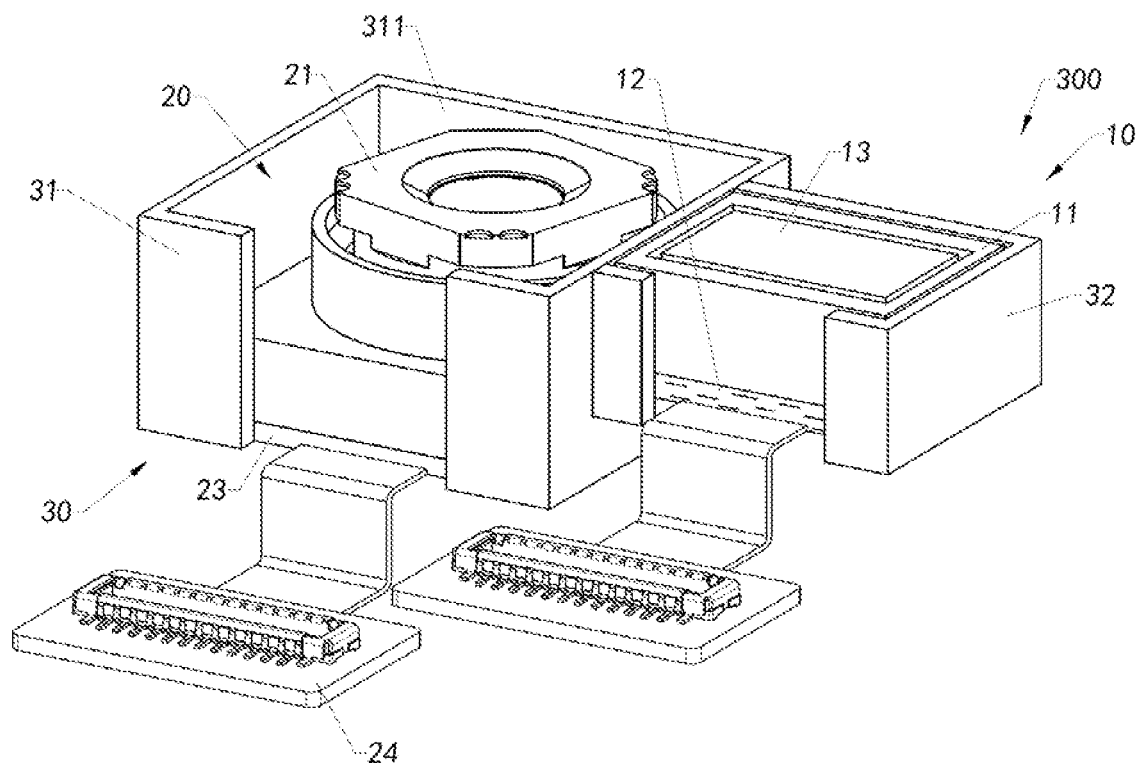
FIG. 2A is an overall schematic view of a TOF camera module of the electronic device according to the above preferred embodiment of the present invention.
Figure 2B:
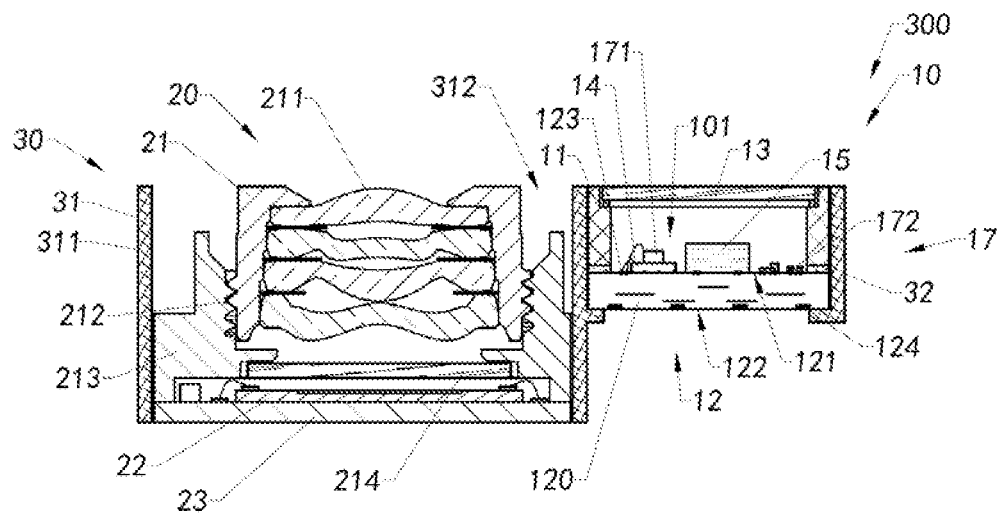
FIG. 2B is an overall cross-sectional view of a TOF camera module of the electronic device according to the above preferred embodiment of the present invention.

As shown in FIGS. 2A and 2B, the receiving module 20 of the TOF camera module 300 further includes a receiving end connector 24, wherein one end of the receiving end connector 24 is electrically connected to the receiving circuit board 23 of the receiving module 20, and by means of the receiving end connector 24, the receiving circuit board 23 of the receiving module 20 is conductively connected to the electronic device mainboard 200.

The projection module 10 includes a support 11, a transmitting circuit board 12, at least one optical element 13, at least one projection unit 14, and at least one driver chip 15, wherein the projection unit 14 and the driver chip 15 are disposed at the same side of the transmitting circuit board 12. The support 11 is disposed on the transmitting circuit board 12, wherein the optical element 13 is attached above the support 11 and is located in a projection path of the projection module 10, and by means of the optical element 13, the light signal projected by the projection unit 14 is diffracted (or expanded, shaped, etc.). The support 11, the transmitting circuit board 12 and the optical element 13 of the projection module 10 are sealed to form an accommodating space 101, wherein the projection unit 14 and the driver chip 15 are built in the closed space 101.

The projection unit 14 and the driver chip 15 are conductively electrically connected to the transmitting circuit board 12, wherein the driver chip 15 controls the projection unit 14 to project a light signal. Specifically, the projection unit 14 is controlled by the driver chip 15 through the transmitting circuit board 12, to control the pulse waveform of the projected light signal. Preferably, in this preferred embodiment of the present invention, the driver chip 15 is disposed adjacent to the projection unit 14, so that the driver chip 15 can control the projection unit 14 to project a light signal with a desired waveform.

It is worth mentioning that the projection unit 14 and the driver chip 15 are attached to the same side of the transmitting circuit board 12, and the driver chip 15 is disposed adjacent to the projection unit 14, so that the wiring distance between the driver chip 15 and the projection unit 14 is shortened, the parasitic inductance of the projection unit 14 is reduced, and the waveform quality of the light signal projected by the projection unit 14 is improved, to improve the signal-to-noise ratio of the projection module 10. Preferably, in this preferred embodiment of the present invention, a distance between the driver chip 15 and the projection unit 14 is less than or equal to 0.5 mm.

The transmitting circuit board 12 of the projection module 10 has an upper end surface (front or upper surface) 121 and a lower end surface (back or lower surface) 122, wherein the projection unit 14 and the driver chip 15 are attached to the upper end surface 121 of the transmitting circuit board 12, and the projection unit 14 are electrically connected by the driver chip 15 to the transmitting circuit board 12 from the upper end surface 121. The support 11 is disposed on the upper end surface 121 of the transmitting circuit board 12.

Figure 3A:
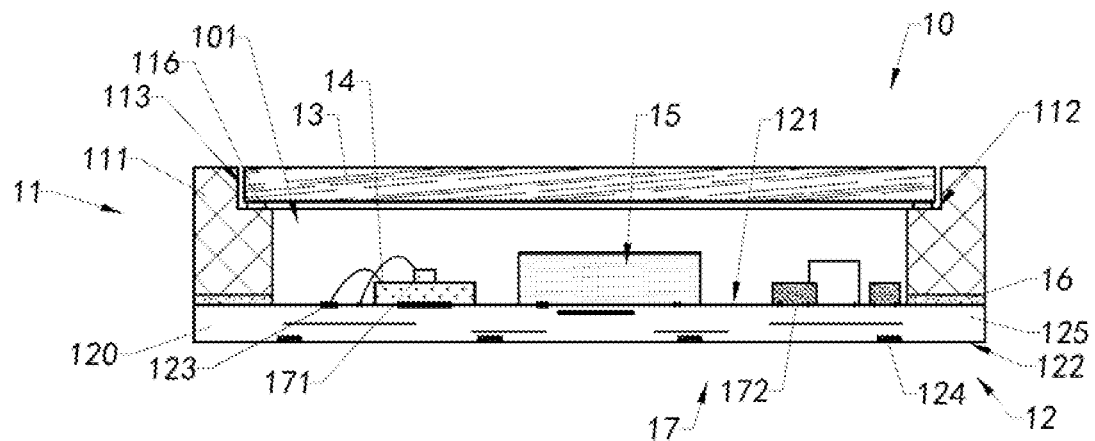
FIG. 3A is a cross-sectional view of a projection module of the TOF camera module according to the above preferred embodiment of the present invention.

As shown in FIG. 3A, the support 11 is attached to the upper end surface 121 of the transmitting circuit board 12, and the support 11 supports the optical element 13 on the projection path of the projection module 10. The support 11 is attached to the upper end surface 121 of the transmitting circuit board 12 in an adhesive manner. Correspondingly, the projection module 10 further includes a connection layer 16, wherein the connection layer 16 is disposed on the upper end surface 121 of the transmitting circuit board 12, and the support 11 is attached to the top of the upper end surface 121 at the connection layer 16 in a bonding manner. Preferably, in this preferred embodiment of the present invention, the connection layer 16 may be but not limited to, a thermally conductive adhesive layer or a soldering layer, that is, it is an adhesive with high heat dissipation, so as to improve the heat dissipation performance of the projection module 10. Preferably, in this preferred embodiment of the present invention, the connection layer 16 may be but not limited to, an adhesive layer, a soldering layer, and other materials having a connection and installation function.

It is worth mentioning that the support 11 can be manufactured by a process such as injection molding or sintering, that is, the support 11 can be integrally formed by a process such as injection molding or sintering. Preferably, in this preferred embodiment of the present invention, the support 11 is a ceramic-sintered ceramic support apparatus. More preferably, the support is made of aluminum nitride ceramic (ALN) material. Since the thermal conductivity of the aluminum nitride ceramic material is better than that of other ceramic materials, and its coefficient of thermal expansion (CTE) is smaller, thus it has good heat dissipation, which is advantageous to the work reliability of the TOF module.

The support 11 of the projection module 10 includes a support body 111 and further has a bearing surface 112 and a mounting groove 113 formed above the bearing surface 112, wherein the optical element 13 is attached to the bearing surface 112 of the support 11, and the optical element 13 is supported in the mounting groove 113 by means of the support body 111. Preferably, the optical element 13 is attached to the mounting groove 113 on the upper end of the support 11 in an adhesive manner, that is, the optical element 13 is bonded above the bearing surface 112 of the support 11.

The projection module 10 further includes a plurality of electronic elements 17, wherein the plurality of electronic elements 17 are conductively electrically connected to the transmitting circuit board 12, at least one of the electronic elements 17 are conductively connected to the projection unit 14 of the projection module 10 through the transmitting circuit board 12, and at least one of the electronic elements 17 are conductively connected to the driver chip 15 through the transmitting circuit board 12. The electronic elements 17 are used to support the projection unit 14 and/or the driver chip 15 of the projection module 10 to work. In the preferred embodiment of the present invention, the electronic elements 17 are conductively disposed on the upper end surface 121 of the transmitting circuit board 12, and the electronic elements 17 are built in the closed space 101.

The electronic elements 17 may be passive electronic means such as resistors, capacitors, and inductors, and the electronic elements 17 may also be other types of electronic means that work in cooperation with the driver chip 15. The electronic elements 17 can reduce the parasitic inductance between the driver chip 15 and the projection unit 14, so as to ensure that the waveform of the light signal emitted by the projection module 10 is close to an ideal square wave. It can be understood that, in this preferred embodiment of the present invention, the electronic elements 17 may also be mounted in other positions of the TOF camera module 300, such as the receiving circuit board 23 of the receiving module 20; or the electronic elements 17 are mounted on the electronic device mainboard 200 of the electronic device, so as to further reduce the overall structure of the TOF camera module 300, which is advantageous to reduce the overall volume of the electronic device. That is to say, although the electronic elements 17 can be configured to improve the pulse waveform of the light signal projected by the projection unit 14, it is not necessary to dispose the electronic elements 17 on the transmitting circuit board 12. Based on the design requirements of the TOF camera module 300 or the overall design requirements of the electronic device, the electronic elements 17 are mounted on the receiving circuit board 23 of the receiving module 20, wherein the electronic elements 17 support the work of the projection unit 14 and/or the driver chip 15 through the conduction between the receiving circuit board 23 and the transmitting circuit board 12; or the electronic elements 17 are mounted on the electronic device mainboard 200, and wherein the electronic element 17 supports the work of the projection unit 14 and/or the driver chip 15 through the electronic device mainboard 200.

As shown in FIGS. 2A and 2B, the projection module 10 and the receiving module 20 of the TOF camera module 300 are conductively connected to the electronic device mainboard 200 through respective connectors. The TOF camera module 300 further includes at least one fixing frame 30, wherein the receiving module 20 is adjustably disposed on the fixing frame 30, and the receiving module 20 is fixed to the electronic device mainboard 200 by means of the fixing frame 30. After the receiving module 20 is conductively disposed on the electronic device mainboard 200, the position of the receiving module 20 on the fixing frame 30 is adjusted so that a receiving end optical axis of the receiving module 20 and a transmitting end optical axis of the projection module 10 are adapted to each other, and thus the TOF camera module 300 has good photographing performance.

Optionally, in other embodiments of the present invention, the projection module 10 and/or the receiving module 20 of the TOF camera module 300 may also be conductively connected to the electronic device mainboard 200 in other conduction manners such as welding/soldering, and the projection module 10 and/or the receiving module 20 are connected to the electronic device mainboard 200 in the welding/soldering manner. It can be understood that, in this preferred embodiment of the present invention, the conduction and connection manner of the TOF camera module 300 is merely used here as an example, rather than a limitation.

It is worth mentioning that in this preferred embodiment of the present invention, the fixing frame 30 can be used to adjustably fix and support the projection module 10 and the receiving module 20, or the fixing frame 30 is used to adjustably fix and support the receiving module 20, wherein the receiving module 20 is directly or indirectly fixed to the electronic device mainboard 200, and the receiving end optical axis of the receiving module 20 is adjusted so that the receiving end optical axis is adapted to the transmitting end optical axis.

Preferably, the fixing frame 30 includes a receiving end fix holder 31 and a transmitting end fix holder 32, wherein the receiving module 20 is adjustably disposed on the receiving end fix holder 31, and the projection module 10 is disposed on the transmitting end fix holder 32. The receiving end fix holder 31 includes a receiving end fix holder body 311 and a receiving end adjusting groove 312, wherein the receiving module 20 is held in the receiving end adjusting groove 312 by the receiving end fix holder body 311. It can be understood that, in this preferred embodiment of the present invention, the receiving module 20 is disposed in the receiving end adjusting groove 312 of the receiving end fix holder 31 in a manner that an optical axis is adjustable. The position of the receiving module 20 in the receiving end adjusting groove 312 is adjusted, to adjust the receiving end optical axis of the receiving module 20, so that the optical axis direction of the receiving module 20 is adapted to the projection module 10.

The projection module 10 is disposed on the transmitting end fix holder 32, and the position of the projection module 10 is raised by means of the transmitting end fix holder 32. It is worth mentioning that the overall height of the projection module 10 is lower than the height of the receiving module 20, and the overall height of the projection module 10 is raised by the transmitting end fix holder 32 of the fixing frame 30, so that the height of the upper end surface of the projection module 10 is adapted to the height of the upper end surface of the receiving module 20.

It can be understood by those skilled in the art that the projection module 10 may also be adjusted to be disposed on the transmitting end fix holder 32, so as to adjust the position of the projection module 10 in the fixing frame 30 in a manner of adjusting the transmitting end optical axis of the projection module 10, so that the optical axis of the projection module 10 and the optical axis of the receiving module 20 are adapted to each other. As shown in FIG. 3A, the projection unit 14 is attached to the upper end surface 121 of the transmitting circuit board 12, wherein one electrode (negative electrode) of the projection unit 14 is disposed on the upper end surface 121, and the other electrode (positive electrode) of the projection unit 14 is welded to the transmitting circuit board 12 through a lead wire, and is electrically connected to the electronic device mainboard 200 through the circuit board 12, for the electronic device mainboard 200 to support the work of the projection unit 14 through the transmitting circuit board 12. In addition, in the preferred embodiment of the present invention, the driver chip 15 and the electronic elements 17 are disposed on the upper end surface 121 of the transmitting circuit board 12 in a welding/soldering manner, and by means of the transmitting circuit board 12, the conduction between the driver chip 15 and the electronic device mainboard 200 is realized, and the conduction between the electronic elements 17 and the electronic device mainboard 200 is realized.

Figure 3B:
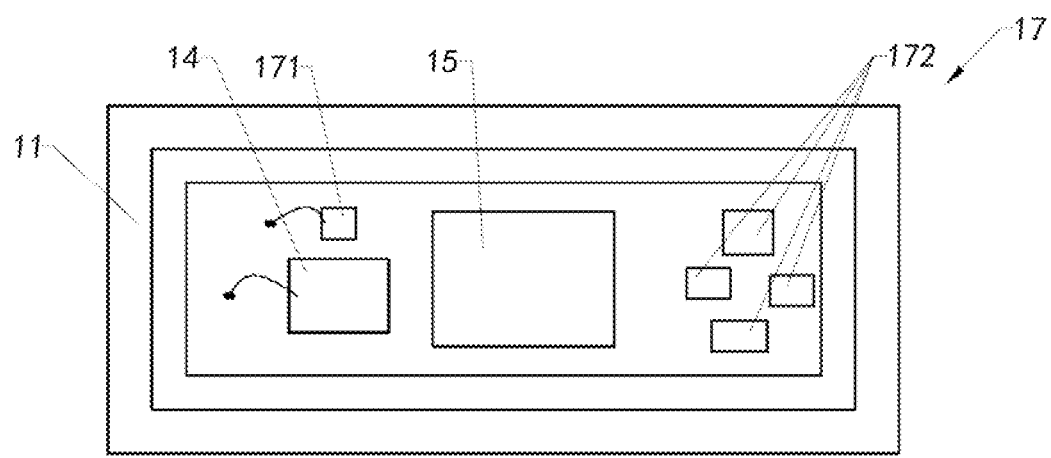
FIG. 3B is a top view of a projection module of the TOF camera module according to the above preferred embodiment of the present invention.

As shown in FIGS. 3A and 3B, the projection unit 14 is disposed adjacent to the driver chip 15, or the driver chip 15 is attached to the transmitting circuit board 12 in a manner adjacent to the projection unit 14. The lead wire connected to the projection unit 14 is disposed on a side of the projection unit 14 in such a manner that it faces away from the driver chip 15, or the lead wire for being connected to the projection unit 14 is disposed at an end of the projection unit 14 facing away from the driver chip 15. In short, in order to arrange the projection unit 14 and the driver chip 15 closer, the lead wire connected to the projection unit 14 is disposed on the side away from the driver chip 15, so that the projection unit 14 and the driver chip 15 are as close as possible. It can be understood that, the closer the relative position of the projection unit 14 and the driver chip 15 is, the closer the waveform of the light signal, which the driver chip 15 controls the projection unit 14 to reflect, is to an ideal waveform, such as a projecting square wave.

Optionally, the lead wire connected to the projection unit 14 is disposed at a side being not adjacent to the driver chip 15. For example, the lead wire connected to the projection unit 14 is disposed to the same side of the driver chip 15 and the projection unit 14. It can be understood that the lead wire connected to the projection unit 14 is disposed away from the driver chip 15, which can reduce the heat generated when the driver chip 15 works and conducted to the lead wire.

Correspondingly, the projection module 10 is conductively disposed on the electronic device mainboard 200 (or the circuit board of the electronic device), wherein in the preferred embodiment of the present invention, the transmitting circuit board 12 of the projection module 10 is conducted to the electronic device mainboard 200 in a welding/soldering manner. Correspondingly, the transmitting circuit board 12 of the projection module 10 further includes a transmitting circuit substrate 120, a plurality of (two or more) upper solder joints 123, at least one lower solder joint 124 and a plurality of conduction circuits 125, wherein the upper solder joints 123 are disposed on the upper end surface 121 of the transmitting circuit substrate 120, and the lower solder joint 124 is disposed on the lower end surface 122 of the transmitting circuit substrate 120. The upper solder joints 123 solder the projection unit 14, the driver chip 15 and the electronic elements 17 of the projection module 10 to the upper end surface 121 of the transmitting circuit board 12.

Each of the upper solder joints 123 and the lower solder joints 124 is electrically connected to the conduction circuit 125, so as to realize the conductive connection between the driver chip 15 and the transmitting unit 14 of the projection module 10 through the conduction circuit 125. Specifically, one end of at least one conduction circuit 125 of the transmitting circuit board 12 is connected to an upper solder joint 123, wherein the upper solder joint 123 is electrically connected to the driver chip 15, and the other end of the conduction circuit 125 is electrically connected another upper solder joint 123 of the upper end surface 121, wherein this another upper solder joint 123 is electrically connected to one electrode of the projection unit 14. It can be understood that the driver chip 15 is disposed adjacent to the projection unit 14, which can effectively reduce the wiring distance between the driver chip 15 and the projection unit 14, and is advantageous to improve the waveform of the light which the driver chip 15 controls the projection unit 14 to emit.

The driver chip 15 of the projection module 10 drives (controls) the projection unit 14 to work through the conduction circuit 125 of the transmitting circuit board 12. One end of at least one conduction circuit 125 of the transmitting circuit board 12 is connected to at least one solder joint 123, wherein the upper solder joint 123 is electrically connected to the driver chip 15, and wherein the other end of the conduction circuit 125 is electrically connected to a lower solder joint 124 to achieve the internal and external conduction of the circuit board 12. One end of at least one conduction circuit 125 is electrically connected to an upper solder joint 123, wherein the upper solder joint 123 is connected to the electronic element 17, and the other end of the conduction circuit 125 is electrically connected to a lower solder joint 124, so as to achieve the internal and external conduction of the circuit board 12.

Preferably, the transmitting circuit board 12 has a ceramic substrate, wherein the driver chip 15, the projection unit 14 and the electronic elements 17 disposed on the transmitting circuit board 12 conduct the generated heat to the transmitting circuit board 12 in a heat conduction manner, thereby dissipating heat through the transmitting circuit board 12. It can be understood that, in this preferred embodiment of the present invention, the material of the transmitting circuit board 12 is merely used here as an example, rather than a limitation.

In the preferred embodiment of the present invention, the projection module 10 is electrically connected to the electronic device mainboard 200 through the lower solder joint 124 of the transmitting circuit board 12, so as to achieve the conductive connection between the projection module 10 and the electronic device mainboard 200.

Figure 3C:
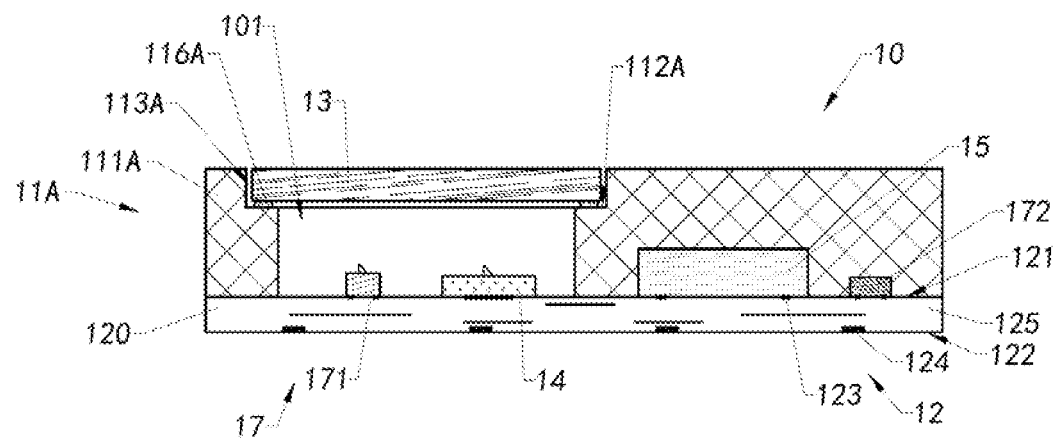
FIG. 3C is a cross-sectional view of a projection module of the TOF camera module according to the above preferred embodiment of the present invention.
Figure 3D:
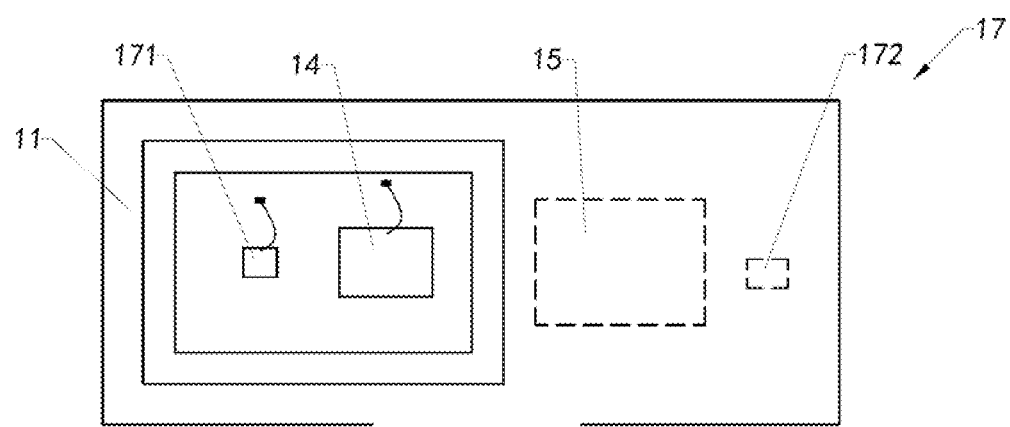
FIG. 3D is a top view of another optional embodiment of a projection module of the TOF camera module according to the above preferred embodiment of the present invention.
Figure 3E:
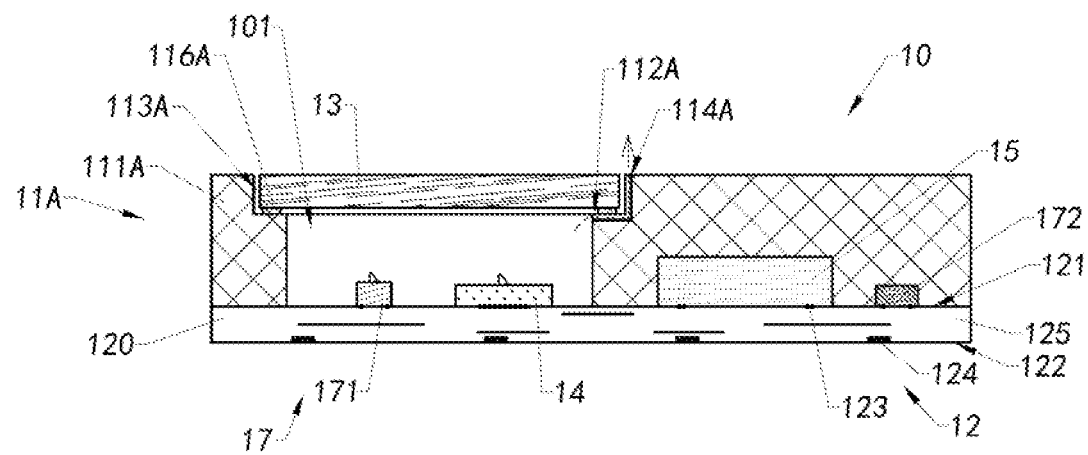
FIG. 3E is a cross-sectional view of a projection module of the TOF camera module according to the above preferred embodiment of the present invention.

FIGS. 3C and 3E show another optional embodiment of a projection module 10 of the above TOF camera module 300 of the present invention, wherein the projection module 10 includes a support 11A, a transmitting circuit board 12, at least one optical element 13, at least one projection unit 14, at least one driver chip 15, and at least one electronic element 17, and wherein the projection unit 14 and the driver chip 15 are disposed on the same side of the transmitting circuit board 12. It is worth mentioning that, it is different from the above preferred embodiment in the support 11A, wherein the support 11A is disposed on the transmitting circuit board 12 by integrally molding. The support 11A is integrally formed above the transmitting circuit board 12 through a molding process, and the driver chip 15 of the projection module 10 is covered by the support 11A.

Preferably, in this preferred embodiment of the present invention, the support 11A is a one-piece molded support, that is, the support 11A is integrally formed on the upper end surface 121 of the transmitting circuit board 12 through a molding process. The driver chip 15 is wrapped by the support 11A on the transmitting circuit board 12, or the driver chip 15 is covered with the support 11A and the transmitting circuit board 12. It can be understood that the support 11A covers (encloses) the driver chip 15 through a molding or sintering process, which can effectively reduce the X and Y (length and width) dimensions of the projection module 10, and is advantageous to reduce the overall volume of the TOF camera module 300. It can be understood that the driver chip 15 is covered (wrapped) by the support 11A, wherein the support 11A can protect the driver chip 15.

It can be understood that after the driver chip 15 is soldered to the upper surface of the transmitting circuit board 12, the support 11A covers (encloses) the driver chip 15 through a molding process, and the driver chip 15 is further fixed by means of the support 11A, improving the strength (reliability) of the projection module 10. The driver chip 15 is covered by the support 11A, wherein the thermal energy generated by the driver chip 15 during work can be conducted to the support 11A in a heat conduction manner, so as to dissipate the heat from the support 11A. Thus, the heat generated by the projection module 10 is prevented from accumulating in the closed space 101, which affects the accuracy and detection distance of the light signal projected by the projection unit 14, or affects the service life of the TOF camera module 300. In short, the support 11A is integrally formed on the transmitting circuit board 12 through a molding process, and the support 11A conducts the heat generated by the driver chip 15 in a heat transfer manner, thereby improving the heat dissipation performance of the projection module 10.

As shown in FIG. 3E, the support 11A is further provided with at least one air escape groove 114A, wherein the air escape groove 114A communicates the accommodating space 101 with an external environment. After the optical element 13 is attached to the mounting groove 113A of the support 11A in an adhesive manner, the projection module 10 is baked or exposed to make the glue (colloid) between the optical element 13 and the support 11A cured. When the optical element 13 is attached to the support 11A, the air escape groove 114A guides the air flow in the accommodating space 101 to prevent the gas in the accommodating space 101 from expanding and causing the optical element 13 to fail to be attached to the support 11A. Preferably, the air escape groove 114A is formed on an upper end part of the support body 111A of the support 11A, wherein the air escape groove 114 communicates with the mounting groove 113A of the support 11A. Therefore, when the optical element 13 is mounted in the mounting groove 113A, the accommodating space 101 is communicated with the external environment by means of the air escape groove 114A, so that the air escape groove 114A guides the air in the accommodating space 101 outward to prevent the air pressure in the accommodating space 101 from being too large. It can be understood that, in this preferred embodiment of the present invention, the location and manner in which the escaped gas groove 114A is formed are merely used as an example, rather than a limitation. More preferably, after the glue for bonding the optical element 13 is cured, the air escape groove 114 of the support 11A is selectively blocked to seal the accommodating space 101.

Figure 3F:
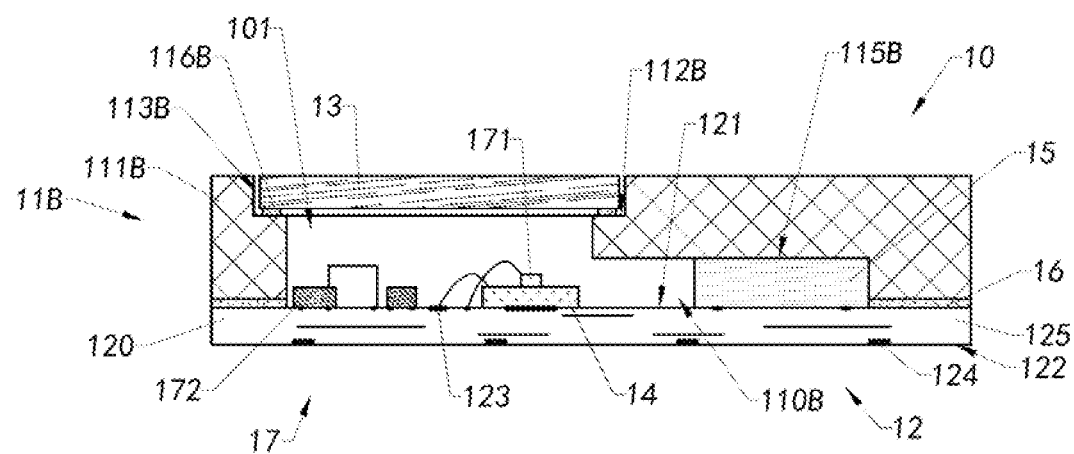
FIG. 3F is a cross-sectional view of a projection module of the TOF camera module according to the above preferred embodiment of the present invention.
Figure 3G:
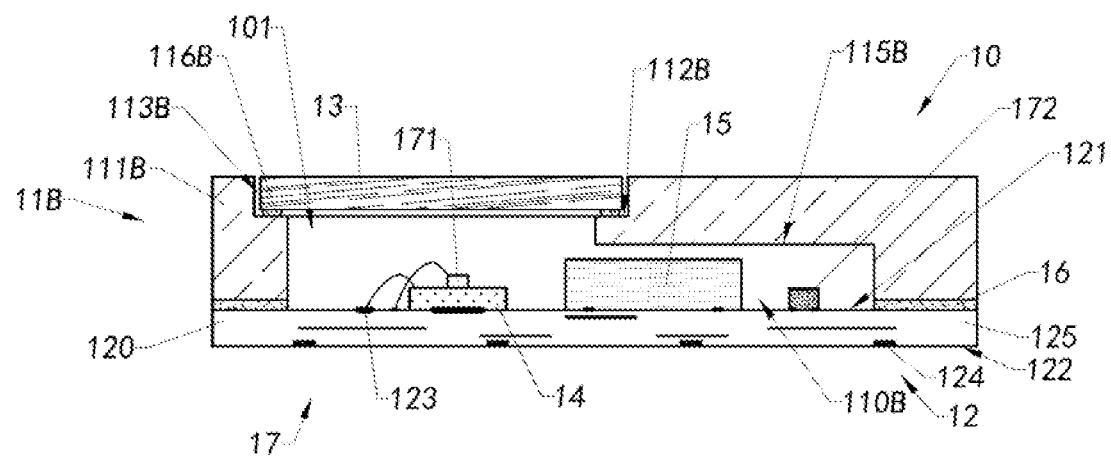
FIG. 3G is a cross-sectional view of a projection module of the TOF camera module according to the above preferred embodiment of the present invention.

FIG. 3F or 3G show another two optional embodiments of a projection module 10 of the above TOF camera module 300 of the present invention, wherein the projection module 10 includes a support 11B, a transmitting circuit board 12, at least one optical element 13, at least one projection unit 14, at least one driver chip 15, and at least one electronic element 17, and wherein the projection unit 14 and the driver chip 15 are disposed on the same side of the transmitting circuit board 12. It is worth mentioning that, it is different from the above preferred embodiment in the support 11B, wherein the support 11B is disposed on the transmitting circuit board 12 in an adhesive manner. It is worth mentioning that the support 11B can be manufactured by a process such as injection molding or sintering, that is, the support 11B can be integrally formed by a process such as injection molding or sintering. Preferably, in this preferred embodiment of the present invention, the support 11B is a ceramic-sintered ceramic support.

The support 11B of the projection module 10 includes a support body 111B and further has a bearing surface 112B and a mounting groove 113B formed above the bearing surface 112B, wherein the optical element 13 is attached to the bearing surface 112B of the support 11B, and the optical element 13 is supported in the mounting groove 113B by means of the support body 111B. It is different from the above first preferred embodiment in that the support 11B covers the upper surface of the driver chip 15, wherein the driver chip 15 is covered by the support 11B in a heat conduction manner, and conducts the heat generated by the driver chip 15 by means of the support 11B. In other words, the support 11B is covered above the driver chip 15, and the driver chip 15 is further fixed on the transmitting circuit board 12 by the support 11B to protect the driver chip 15.

As shown in FIGS. 3F and 3G, the support 11B is further provided with an accommodating cavity 110B, wherein the accommodating cavity 110B is formed below the support main body 111B of the support 11B, and the driver chip 15 is covered by the support body 111B on the accommodating cavity 110B. The heat generated by the driver chip 15 is conducted outward by the support body 111B of the support 11B, wherein the upper surface of the driver chip 15 is completely or partially covered by the support body 111B of the support 11B, and the support body 111B contacts the driver chip 15 in a heat conduction manner for the support body 111B to dissipate heat.

As shown in FIG. 3F, the support 11B is further provided with at least one heat conduction surface 115B, wherein the heat conduction surface 115B is formed above the accommodating cavity 110B, and when the support 11B is mounted on the transmitting circuit board 12, the heat conduction surface 115B of the support 11B conducts the heat generated by the driver chip 15 during work outward through the support body 111B of the support 11B in a direct thermal contact manner or an indirect heat conduction manner, so as to avoid heat accumulation in the accommodating space 101.

As shown in FIGS. 3F and 3G, the upper end of the support 11B extends inward, wherein the upper end of the support 11B is covered above the driver chip 15, wherein the optical element 13 is supported by the support 11B above the projection unit 14. That is, in the preferred embodiment of the present invention, the upper end of the support 11B extends inward to reduce the size of the optical element 14.

Figure 3H:
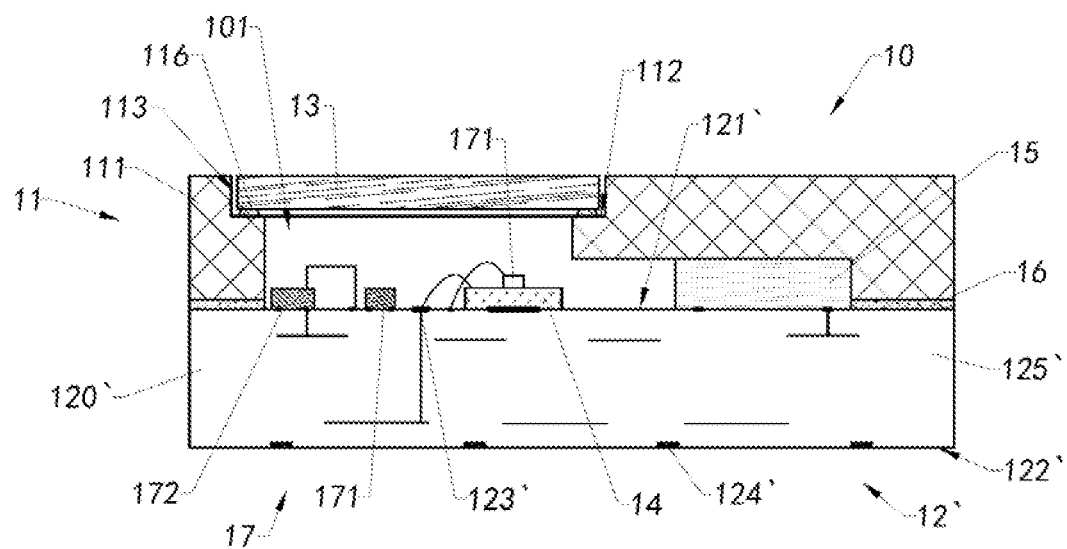
FIG. 3H is a cross-sectional view of another optional embodiment of a projection module of the TOF camera module according to the above preferred embodiment of the present invention.
Figure 4A:
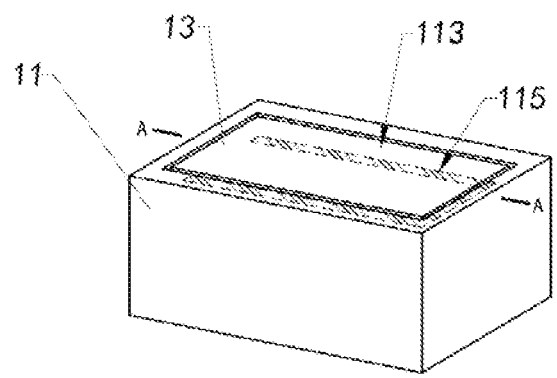
FIG. 4A is a schematic perspective view of partial adhesive mounting of a projection module of the TOF camera module according to the above preferred embodiment of the present invention.
Figure 4B:
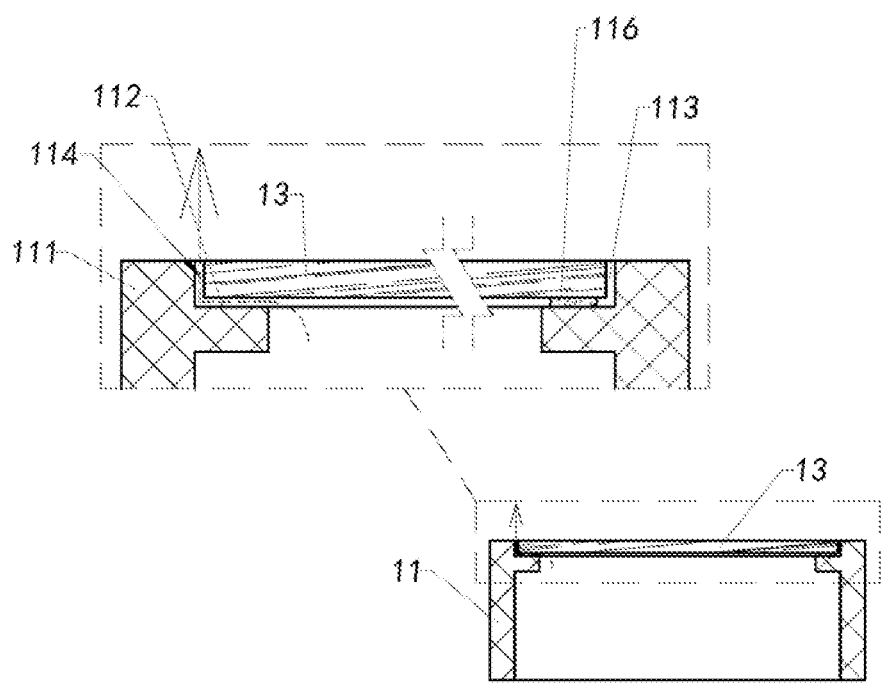
FIG. 4B is a schematic cross-sectional view of partial adhesive mounting of the projection module of the TOF camera module according to the above preferred embodiment of the present invention.

FIG. 3H shows another optional embodiment of a projection module 10 of the above TOF camera module 300 of the present invention. The projection module 10 includes a support 11, a transmitting circuit board 12', at least one optical element 13, at least one projection unit 14, at least one driver chip 15, and at least one electronic element 17, wherein the projection unit 14 and the driver chip 15 are disposed on the same side of the transmitting circuit board 12. It is different from the above first preferred embodiment in the transmitting circuit board 12' of the projection module 10 of the TOF camera module, wherein the transmitting circuit board 12' can be formed by using a molding process or integrated ceramic sintering, and the projection unit 14 of the projection module 10 is conductively connected to the driver chip 15 by means of the circuit board 12'. The transmitting circuit board 12' of the projection module 10 is also conductively connected to the electronic device mainboard 200. The support 11, the projection unit 14 and the driver chip 15 of the projection module 10 are disposed above the transmitting circuit board 12', and the overall height of the support 11, the projection unit 14 and the driver chip 15 is raised by means of the circuit board 12'. Therefore, based on the design requirements of the TOF camera module 300, the thickness of the transmitting circuit board 12' can be designed, so that the projection module 10 and the receiving module 20 of the TOF camera module 300 are adapted to each other in height.

Preferably, in this preferred embodiment of the present invention, the transmitting circuit board 12' is an integrated ceramic circuit board formed by ceramic sintering, wherein the ceramic circuit board has good thermal conductivity, which is advantageous to improve the heat dissipation of projection module 10. It can be understood that, the material of the transmitting circuit board 12' is merely used here as an example, rather than a limitation. Therefore, the transmitting circuit board 12' may also be implemented as other types of circuit board types, such as a one-piece molded circuit board.

It is worth mentioning that, in the preferred embodiment of the present invention, the projection module 10 and the receiving module 20 of the TOF camera module 300 are independently mounted structures, wherein the transmitting circuit board 12' of the projection module 10 can be integrally molded on the electronic device mainboard 200. It can be understood by those skilled in the art that, the transmitting circuit board 12' of the projection module 10 may also be integrally molded on the receiving module 20; or the transmitting circuit board 12' may also be integrally molded on other electrical connection apparatuses, such as a flexible board. Then, the projection module 10 is electrically connected to the electronic device mainboard 200 by the flexible board.

Specifically, the transmitting circuit board 12' includes a transmitting circuit substrate 120', and a plurality of upper solder joints 123', a plurality of lower solder joints 124' and at least one conduction circuit 125 disposed on the transmitting circuit substrate 120', wherein the upper solder joints 123' are disposed on the upper end of the transmitting circuit substrate 120', at least one of the upper solder joints 123' is used to be conductively connected to the projection unit 14 of the projection module 10, at least one of the upper solder joints 123' is used to be conductively connected to the driver chip 15 of the projection module 10, and at least one of the upper soldered joints 123' is used to be conductively connected to the electronic elements 17 of the projection module 10. It is the same as the above first preferred embodiment that, the upper solder joints 123' are electrically connected to the lower solder joints 124' through the conduction circuit 125', and the upper solder joint 123' corresponding to the driver chip 15 is electrically connected to the upper solder joint 123' for conducting the projection unit 14 through the conduction circuit 125', so that the projection unit 14 is conductively connected to the driver chip 15.

In this preferred embodiment of the present invention, the conduction circuit 125', the upper solder joints 123' and the lower solder joints 124' are integrally disposed on the transmitting circuit substrate 120', or when the conduction circuit 125', the upper solder joints 123' and the lower solder joints 124' are preset, the transmitting circuit substrate 120' is integrally formed in a manner of sintering or molding. The upper solder joints 123' are embedded in the upper end surface of the transmitting circuit substrate 120', and the lower solder joints 124' are embedded in the lower end surface of the transmitting circuit substrate 120', wherein the conduction circuit 125' is built (wrapped) in the transmitting circuit substrate 120'. In this preferred embodiment of the present invention, the transmitting circuit substrate 120' of the transmitting circuit board 12' is preset with the conduction circuit 125', the upper solder joints 123' and the lower solder joints 124' before the sintering or molding process, so as to ensure that the projection unit 14, the driver chip 15 and the electronic elements 17 electrically connected to the upper solder joints 123' can be conducted.

As shown in FIGS. 3A to 3D, the electronic elements 17 may further include an active electronic component, wherein the electronic elements 17 are electrically connected to the transmitting circuit board 12 of the projection module 10, and the driver chip 15 of the projection module 10 is controlled or supported by means of the electronic elements 17 to work. The electronic element 17 further includes at least one photodiode (PD) 171, wherein the photodiode 171 is disposed on the transmitting circuit board 12, wherein the photodiode 171 is conductively connected to the drive chip 15. The photodiode 171 is an eye-safe and skin-safe monitoring device, wherein the photodiode 171 monitors the light changes in the projection module 10, and converts the received light into a corresponding current signal and then transmits it to the driver chip 15, for the driver chip 15 to control the working power of the projection unit 14 based on the monitored light changes. It can be understood that once the projection is abnormal, the photodiode 171 sends a control signal to the driver chip 15, for the driver chip 15 to stop the projection work of the projection unit 14, so as to protect the work of the TOF camera module 300.

As shown in FIGS. 3A and 3B, the photodiode 171 is attached to the upper end surface 121 of the transmitting circuit board 12, wherein one electrode (negative electrode) of the photodiode 171 is disposed on the upper end surface 121, and the other electrode (positive electrode) of the photodiode 171 is welded to the transmitting circuit board 12 through a lead wire, and is electrically connected to the electronic device mainboard 200 through the circuit board 12, for the electronic device mainboard 200 to support the work of the photodiode 171 through the transmitting circuit board 12. The photodiode 171 is disposed adjacent to the projection unit 14, or the projection unit 14 is attached to the transmitting circuit board 12 in a manner adjacent to the photodiode 171. The lead wire connected to the photodiode 171 is disposed on a side of the photodiode 171 in such a manner that it faces away from the projection unit 14, or the lead wire for being connected to the photodiode 171 is disposed at an end of the photodiode 171 facing away from the projection unit 14. In short, in order to arrange the photodiode 171 and the projection unit 14 closer, the lead wire connected to the a photodiode 171 is disposed on the side away from the projection unit 14, so that the photodiode 171 and the projection unit 14 are as close as possible.

As shown in FIGS. 3C and 3D, the lead wire connected to the photodiode 171 is disposed at a side being not adjacent to the projection unit 14. For example, the lead wire connected to the photodiode 171 is disposed to the same side of the projection unit 14 and the photodiode 171. It can be understood that the lead wire connected to the photodiode 171 is disposed away from the projection unit 14, which can reduce the heat generated when the projection unit 14 works and conducted to the lead wire.

As shown in FIGS. 3A to 3D, the electronic element 17 further includes a negative temperature coefficient (NTC) device 172, wherein the negative temperature coefficient device 172 is conductively disposed on the transmitting circuit board 12. The negative temperature coefficient device 172 is used to monitor the real-time temperature of the projection unit 14 and transmit data to the driver chip 15 in real time, for the driver chip 15 to control the working power of the projection unit 14 based on the negative temperature coefficient device 172.

Referring to FIGS. 4A to 5C of the drawings of the present invention, the optical element 13 is attached to the support 11 in an adhesive manner, wherein the projection module 10 is provided with an air escape structure, wherein the air escape structure communicates the accommodating space 101 with an external environment, so that the gas in the accommodating space 101 is guided by the air escape structure to the external environment during the drying process of the glue, so as to balance the accommodating space 101 and the external air pressure. It can be understood that during the drying process of the glue, the air pressure in the accommodating space 101 increases with an air expansion, which may easily cause the optical element 13 attached to the upper end of the support 11 to fall off. The air escape structure of the projection module 10 can balance the air pressure between the accommodating space 101 and the outside, so as to prevent the optical element 13 from falling off during the baking process of the projection module 10.

In detail, in the preferred embodiment of the present invention, the support 11 is further provided with at least one glue painting area 110, wherein the glue is applied on the glue painting area 110 of the support 11. Preferably, in this preferred embodiment of the present invention, the glue painting area 110 is disposed on the bearing surface 112 of the support 11, that is, glue is applied on the bearing surface 112 of the support 11. The optical element 13 is disposed in the mounting groove 113 of the support 11, wherein the glue between the glue painting area 110 and the optical element 13 is cured to form at least one cured glue layer 116. The optical element 13 is fixed on the bearing surface 112 of the support 11 by means of the cured glue layer 116. It is worth mentioning that the bonding range and the thickness of the cured glue layer 116 are determined by the amount of glue applied to the glue painting area 110 and the range of applying the glue. The cured glue layer 116 after being cured and fixed blocks the gap between the support 11 and the optical element 13. In other words, the cured glue layer 116 formed after the glue is cured has a certain thickness, wherein the cured glue layer 116 isolates the accommodating space 101 from the external environment.

Correspondingly, an air escape gap 117 is formed between the uncoated glue painting area 110 and the optical element 13, wherein after the glue is cured, the air escape gap 117 is formed in the same layer of the cured glue layer 116. The air escape gap 117 communicates the accommodating space 101 with the external environment. When the glue applied to the glue painting area 110 is dried and cured, the air escape gap 117 guides the gas in the accommodating space 101 to move, so as to keep the pressure balance between the accommodating space 101 and the external environment.

Figure 5A:
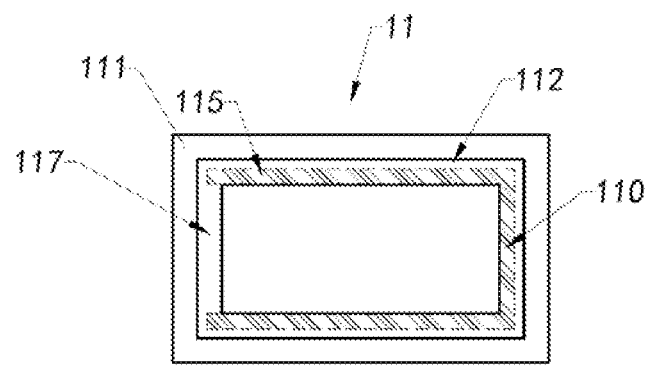
FIG. 5A is a schematic view of glue painting of the projection module of the TOF camera module according to the above preferred embodiment of the present invention.
Figure 5B:
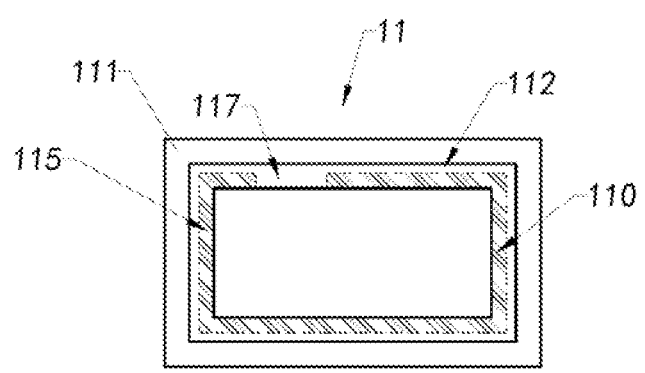
FIG. 5B is a schematic view of glue painting of the projection module of the TOF camera module according to the above preferred embodiment of the present invention.
Figure 5C:
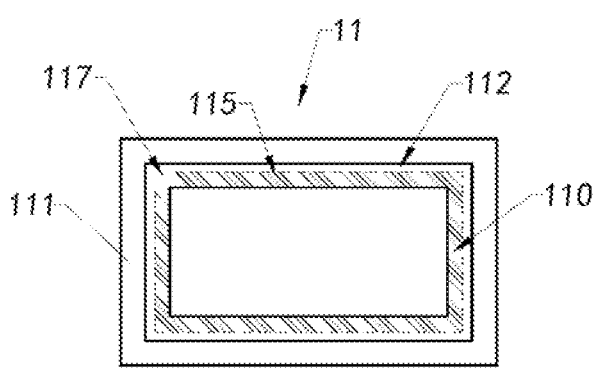
FIG. 5C is a schematic view of glue painting of the projection module of the TOF camera module according to the above preferred embodiment of the present invention.

FIGS. 5A to 5C show several different ways of painting glue in the glue painting area 110. As shown in FIG. 5A, three sides of the glue painting area 110 are applied with glue, wherein the cured glue layer 116 produced by curing the glue is formed on the three sides of the glue painting area 110. In other words, glue is applied to three sides of the glue painting area 110, wherein the air escape gap 117 is formed above the glue painting area 110 for glue application.

As shown in FIGS. 5B and 5C, glue is applied on the glue painting area 110, wherein at least one break is provided during the glue applying process, and the air escape gap 117 is formed at the break position after the glue is cured and fixed. Preferably, during the process of painting the glue, the position where the glue painting starts and the position where the glue painting ends are not connected, so as to form a glue painting break; or the glue painting break is formed by interrupting the glue application during the glue painting process.

In this preferred embodiment of the present invention, the break position can be set at a corner of the glue painting, the position where the glue painting starts is on one side of the corner, and the position where the glue painting ends is on the other side of the corner, so that the line goes through one less corner when being painted. It should be noted that the speed of painting glue in a corner is to be reduced, and it is advantageous to improve the production efficiency with less corners (or arcs) and more straight lines.

Figure 6:
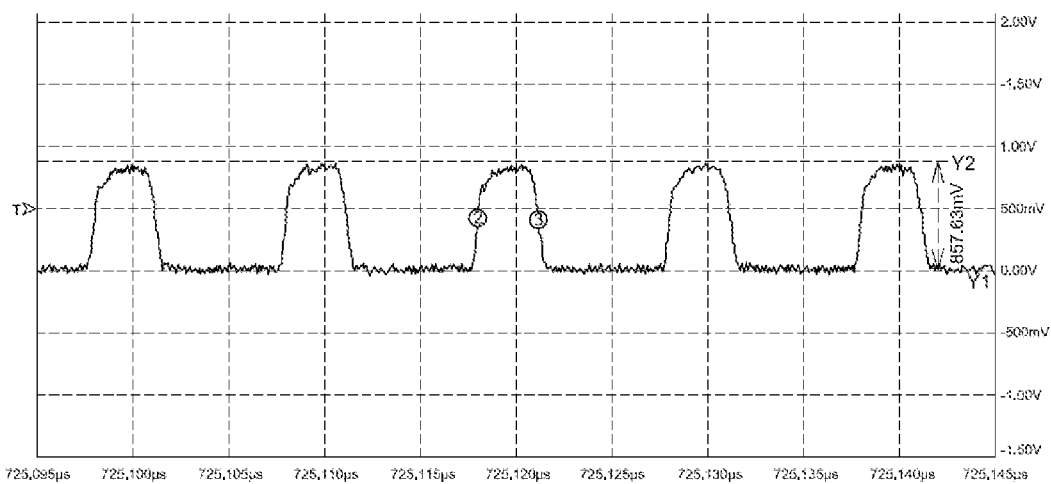
FIG. 6 is a waveform view of a pulse projected by the projection module of the TOF camera module according to the above preferred embodiment of the present invention.

FIG. 6 of the drawings shows the pulse waveform of the detection light signal emitted by the projection unit 14 controlled by the driver chip 15 of the projection module 10 of the present invention. Preferably, in this preferred embodiment of the present invention, the driver chip 15 controls the projection unit 14 to emit the light signal in the form of a square wave. It is worth mentioning that, the shorter the wiring distance between the driver chip 15 of the projection module 10 and the projection unit 14 is, the closer the pulse waveform of the light signal projected by the projection unit 14 is to a square wave.

Preferably, in this preferred embodiment of the present invention, the projection unit 14 may be a vertical cavity surface emitting laser (VCSEL).

FIGS. 7A to 7F of the drawings of the present invention show several other optional embodiments of the projection module 10 of the TOF camera module 300, wherein the projection module 10 is conductively disposed on the electronic device mainboard 200 in a manner of using a flexible board for conduction, that is, the projection module 10 is connected to the electronic device mainboard 200 in a manner of disposing the flexible board.

Figure 7A:
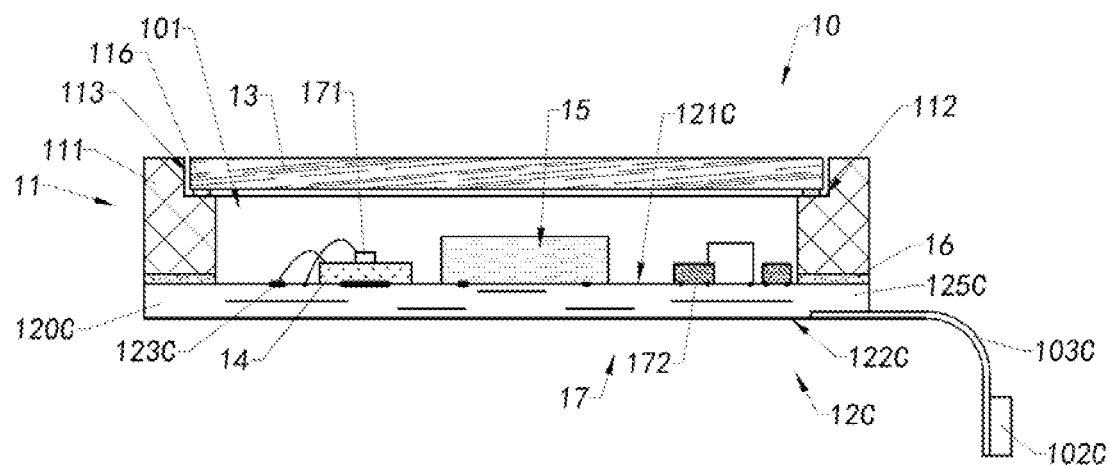
FIG. 7A is a cross-sectional view of a projection module of the TOF camera module according to the above preferred embodiment of the present invention.
Figure 7B:
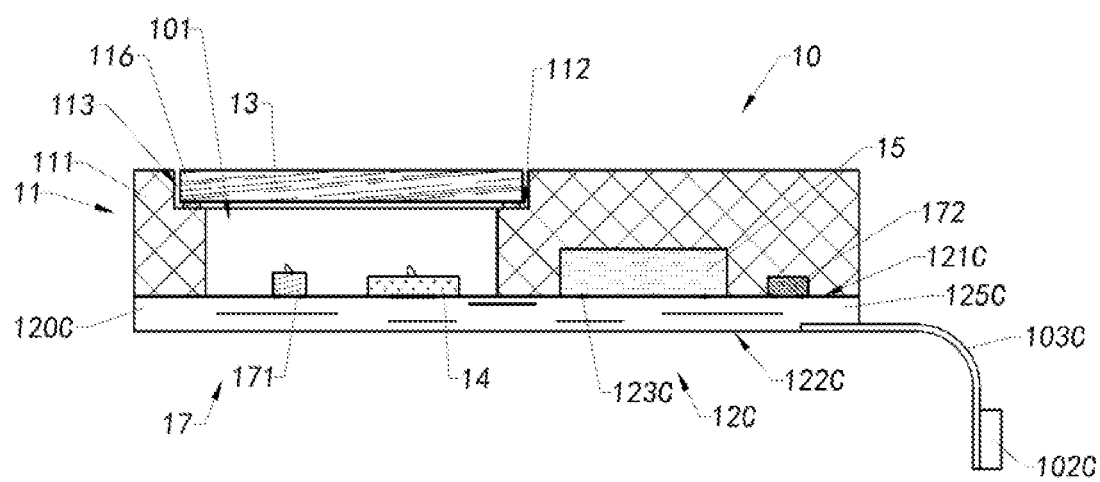
FIG. 7B is a cross-sectional view of a projection module of the TOF camera module according to the above preferred embodiment of the present invention.
Figure 7C:
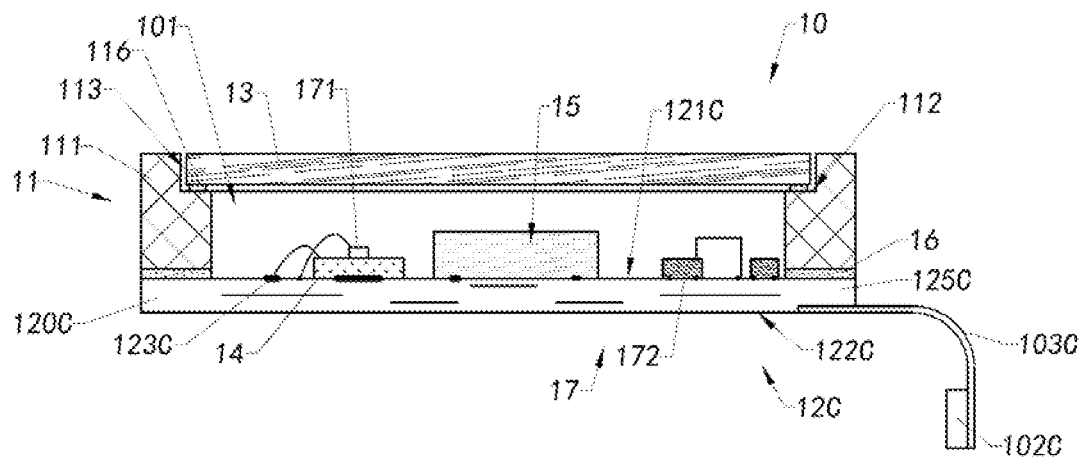
FIG. 7C is a cross-sectional view of a projection module of the TOF camera module according to the above preferred embodiment of the present invention.
Figure 7D:
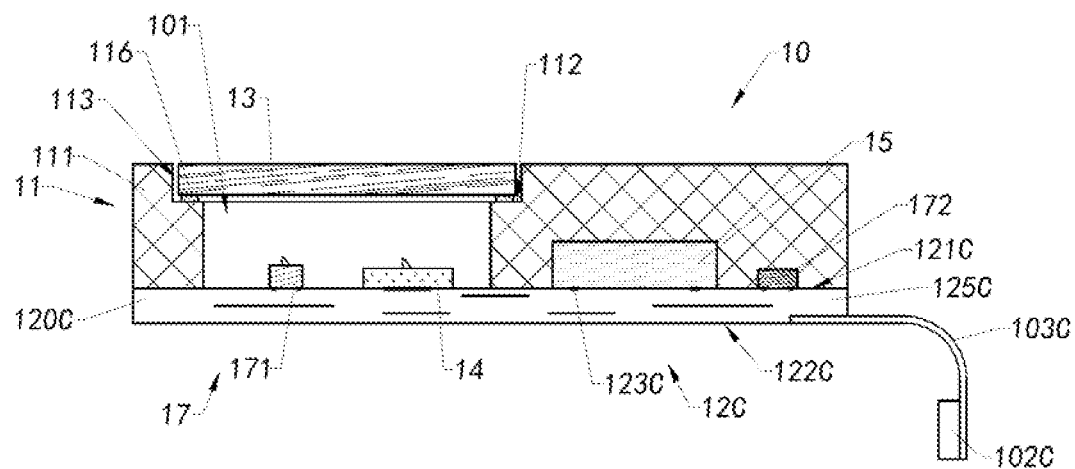
FIG. 7D is a cross-sectional view of a projection module of the TOF camera module according to the above preferred embodiment of the present invention.

FIGS. 7A and 7C show two optional embodiments of the projection module 10 of the above TOF camera module 300, wherein the projection module 10 includes a support 11, a transmitting circuit board 12C, at least one optical element 13, at least one projection unit 14, at least one driver chip 15, and at least one electronic element 17, and wherein the projection unit 14 and the driver chip 15 are disposed on the same side of the transmitting circuit board 12C. It is different from the above-mentioned preferred embodiment in that the transmitting circuit board 12C is conductively connected to the electronic device mainboard 200 in a manner of a flexible board connection. In detail, the projection module 10 further includes at least one flexible board 103C and a connector 102C, wherein one end of the flexible board 103C is electrically connected to the transmitting circuit board 12C, and wherein the other end of the flexible board 103C is conductively connected to the electronic device mainboard 200 through the connector 102C.

It can be understood that, in this optional embodiment of the present invention, there is no need to set solder joints below the transmitting circuit board 12C of the projection module 10, and the transmitting circuit board 12C is conductively connected to the electronic device mainboard 200 through the flexible board 103C.

It can be understood by those skilled in the art that the flexible board 103C is a flexible circuit board, which can be bent so as to conductively connect the projection module 10 to the electronic device mainboard 200. The transmitting circuit board 12C conductively connects the transmitting circuit board 12C to the electronic device mainboard 200 through the flexible board 103C.

In this preferred embodiment of the present invention, the support 11 is disposed on the upper surface of the transmitting circuit board 12C in a bonding manner. The support 11 can be manufactured by a process such as injection molding or sintering, that is, the support 11 can be integrally formed by a process such as injection molding or sintering. Preferably, in this preferred embodiment of the present invention, the support 11 is a ceramic-sintered ceramic support apparatus. As shown in FIG. 7A, the connector 102C is conductively disposed above one end of the flexible board 103C. As shown in FIG. 7C, the connector 102C is conductively disposed below one end of the flexible board 103C.

FIGS. 7A and 7C show two optional embodiments of a projection module 10 of the above TOF camera module 300 of the present invention, wherein the projection module 10 includes a support 11, a transmitting circuit board 12C, at least one optical element 13, at least one projection unit 14, at least one driver chip 15, and at least one electronic element 17, and wherein the projection unit 14 and the driver chip 15 are disposed on the same side of the transmitting circuit board 12C. It is different from the optional implementation of the above preferred embodiment in that the support 11 of the projection module 10 is a molded support, wherein the support 11 is integrally formed on the upper surface of the transmitting circuit substrate 12C by a molding process.

Figure 7E:
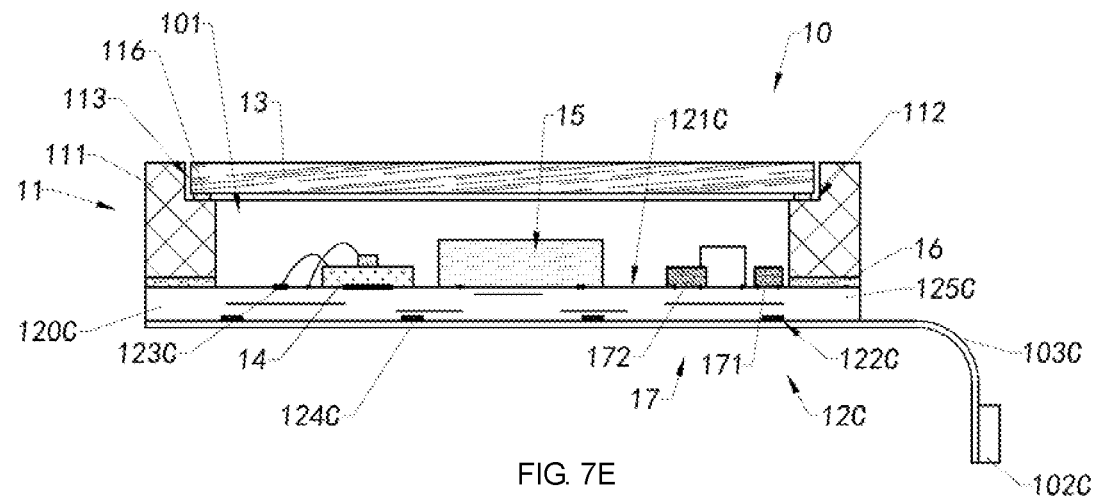
FIG. 7E is a cross-sectional view of a projection module of the TOF camera module according to the above preferred embodiment of the present invention.
Figure 7F:
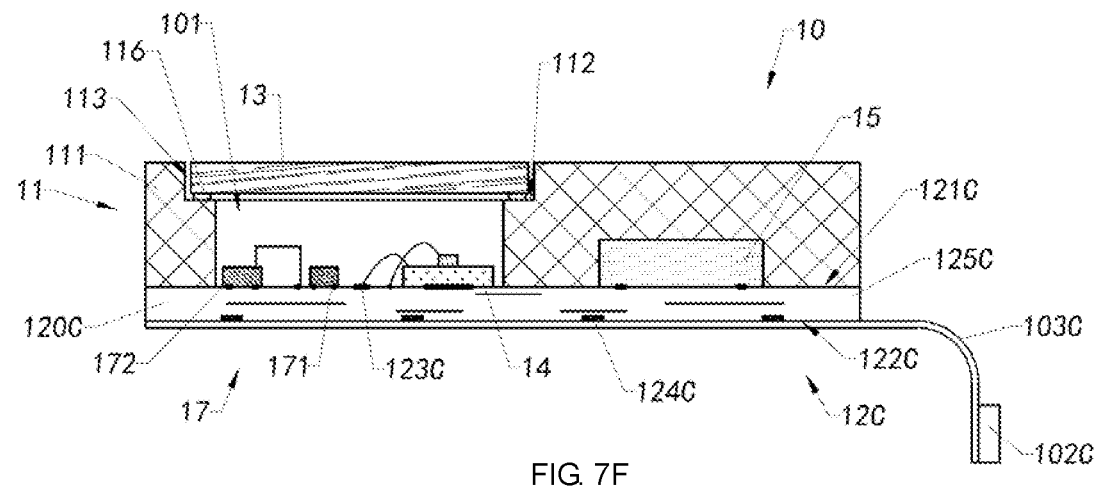
FIG. 7F is a cross-sectional view of a projection module of the TOF camera module according to the above preferred embodiment of the present invention.

FIGS. 7E and 7F illustrate another two optional embodiments of the projection module 10 of the above TOF camera module 300, wherein the projection module 10 includes a support 11, a transmitting circuit board 12, at least one optical element 13, at least one projection unit 14, at least one driver chip 15, and at least one electronic element 17, and wherein the projection unit 14 and the driver chip 15 are disposed on the same side of the transmitting circuit board 12. It is different from the above preferred embodiment in the manner in which the transmitting circuit board 12 of the projection module 10 is conductively connected to the electronic device mainboard 200. In detail, the projection module 10 further includes a flexible board 103C and a connector 102C, wherein the flexible board 103C is a flexible circuit board. One end of the flexible board 103C is attached below the transmitting circuit board 12, wherein the transmitting circuit board 12 is conductively connected to the flexible board 103C in a welding/soldering manner, and the transmitting circuit board 12 is electrically connected to the electronic device mainboard 200 by means of the flexible board 103C. The other end of the flexible board 103C is electrically connected to the connector 102C, wherein the connector 102C is conductively connected to the electronic device mainboard 200, and the flexible board 103C is conductively connected to the electronic device mainboard 200 by means of the connector 102C.

It is worth mentioning that, in this optional embodiment of the present invention, the structure and function of the transmitting circuit board 12 are the same as those in the above first preferred embodiment. The lower solder joints 124 of the transmitting circuit board 12 are electrically connected to one end of the flexible board 103C, and the transmitting circuit board 12 is electrically connected to the electronic device mainboard 200 by means of the flexible board 103C. In short, the transmitting circuit board 12 is conductively attached to the flexible board 103C, and the transmitting circuit board 12 is electrically connected to the electronic device mainboard 200 through the flexible board 103C.

It is worth mentioning that in this preferred embodiment of the present invention, the support 11 may be manufactured by a process such as injection molding or sintering, that is, the support 11 may be integrally formed by a process such as injection molding or sintering. The support 11 is disposed above the transmitting circuit board 12 in a bonding or integral molding manner.

Figure 8:
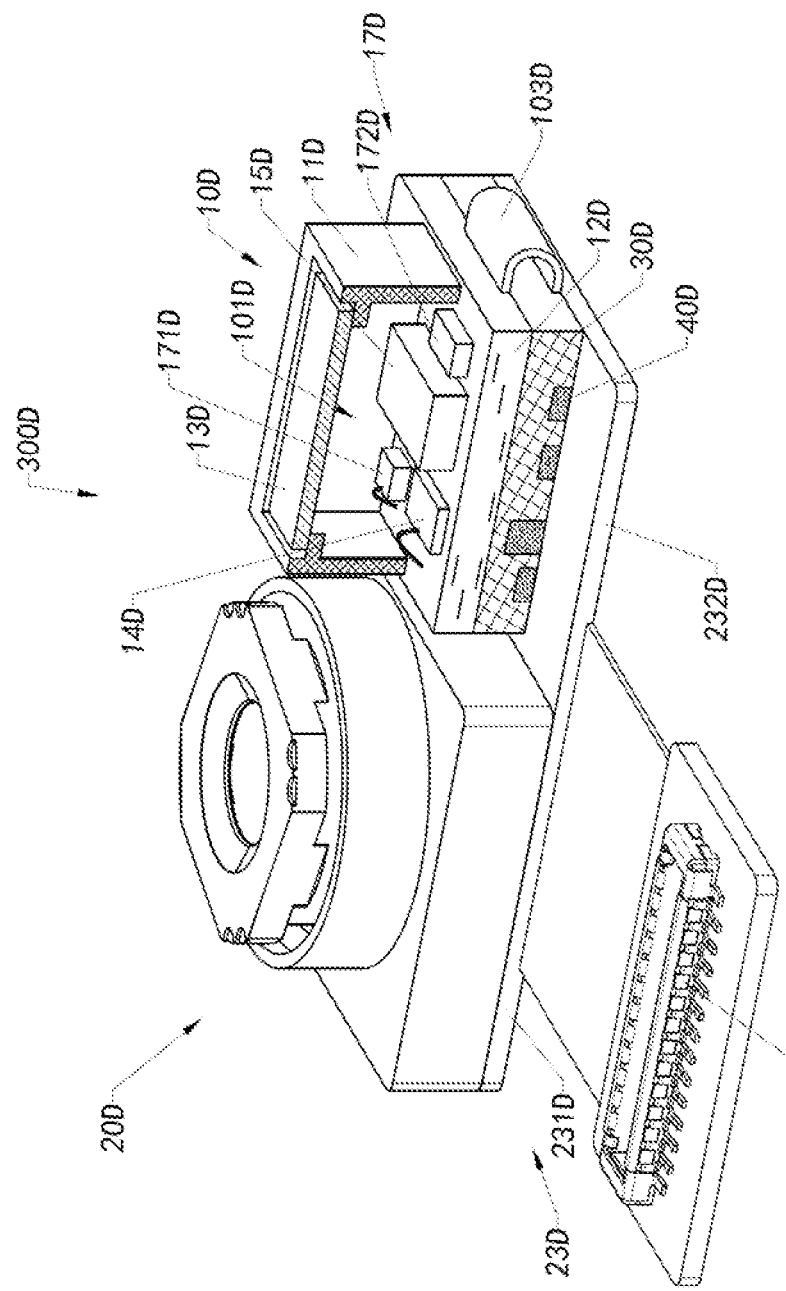
FIG. 8 is an overall schematic view of a TOF camera module of the electronic device according to the above preferred embodiment of the present invention.
Figure 9A:
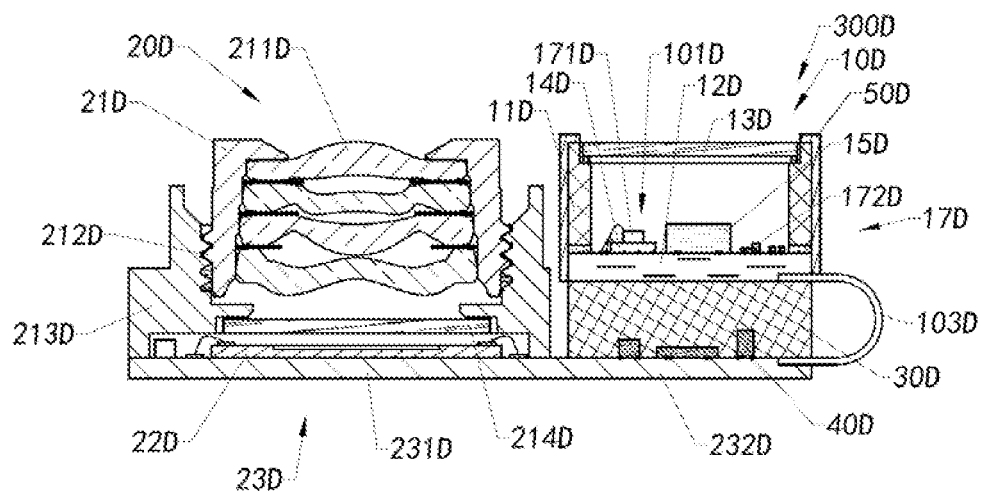
FIG. 9A is a cross-sectional view of a TOF camera module of the electronic device according to the above preferred embodiment of the present invention.
Figure 9B:
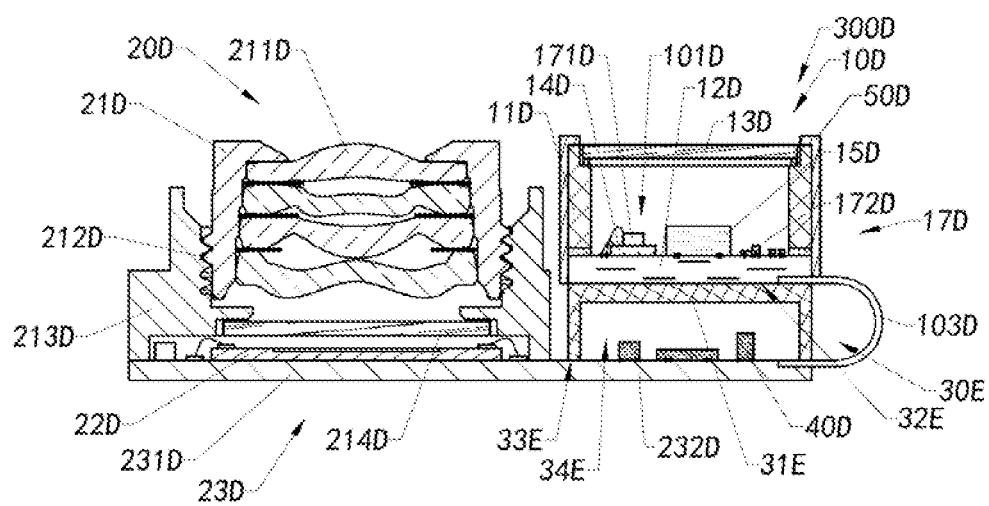
FIG. 9B is a cross-sectional view of a TOF camera module of the electronic device according to the above preferred embodiment of the present invention.
Figure 9C:
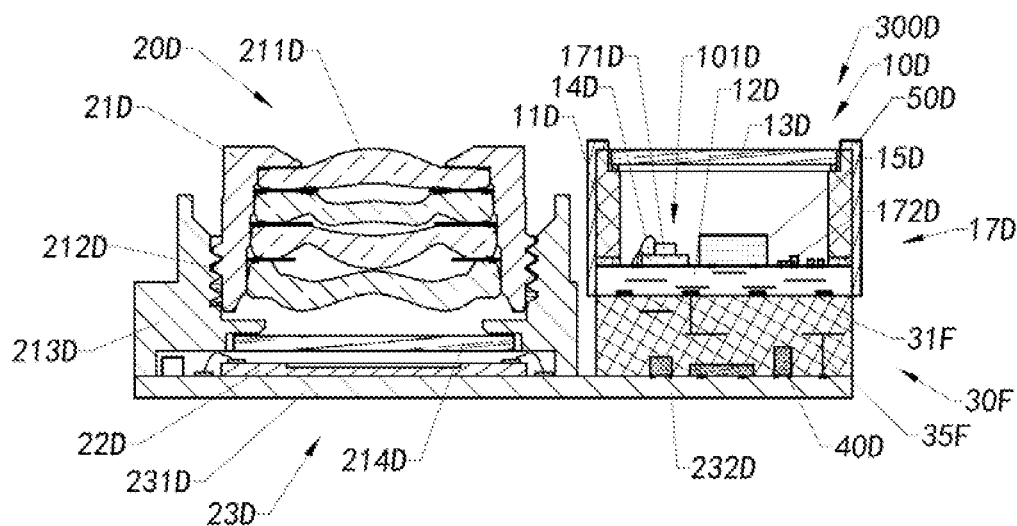
FIG. 9C is a cross-sectional view of a TOF camera module of the electronic device according to the above preferred embodiment of the present invention.
Figure 9D:
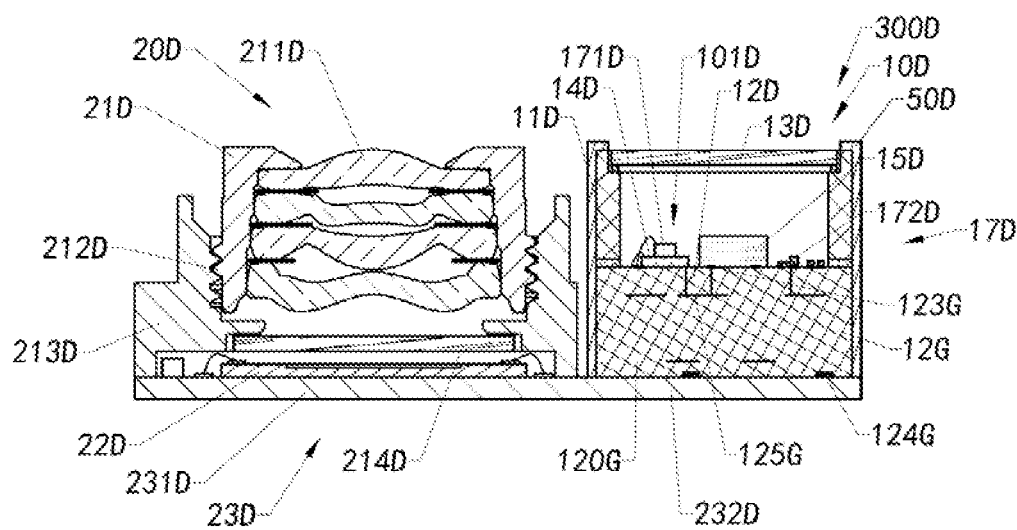
FIG. 9D is a cross-sectional view of a TOF camera module of the electronic device according to the above preferred embodiment of the present invention.

Referring to FIGS. 8 to 9D of the drawings of the present invention, another preferred embodiment of a TOF camera module 300D of the electronic device according to the above preferred embodiment example of the present invention is illustrated in the following description. The TOF camera module 300D is assembled into an integrated camera module, wherein the TOF camera module 300D includes a projection module 10D and a receiving module 20D, wherein the projection module 10D is disposed adjacent to the receiving module 20D, the projection module 10D is conductively connected to the receiving module 20D, and the projection module 10D is controlled by means of the receiving module 20D to work. The projection module 10D is conductively disposed on the receiving module 20D, wherein the receiving module 20D is conductively connected to the electronic device mainboard 200, that is, the electronic device mainboard 200 supports the work of the projection module 10D through the receiving module 20D.

It can be understood that, in this preferred embodiment of the present invention, the TOF camera module 300D may further include a lens holder, which is used to fix the projection module 10D and the receiving module 20D and maintain the relative position of the projection module 10 and the receiving module 20D to be fixed.

In detail, the receiving module 20D includes a lens assembly 21D, a photosensitive element 22, and at least one receiving circuit board 23D, wherein the lens assembly 21D is disposed above the photosensitive element 22D, and the photosensitive element 22D is provided with a photosensitive path by means of the lens assembly 21D, so as to project external light to the photosensitive element 22 through the photosensitive path. It is different from the above first preferred embodiment in that the receiving circuit board 23D includes a circuit board receiving end 231D and a circuit board transmitting end 232D integrally extending from the circuit board receiving end 231D, wherein the photosensitive element 22D is attached to the circuit board receiving end 231D of the receiving circuit board 23D. The projection module 10D is conductively disposed on the circuit board transmitting end 232D of the receiving circuit board 23D, and by means of the receiving circuit board 23D, the projection module 10D is supported and the distance between the projection module 10D and the receiving modules 20D is positioned.

It can be understood that, the projection module 10D and the receiving module 20D of the TOF camera module 300D are assembled into an integrated structure, wherein when the TOF camera module 300D is mounted on the electronic device mainboard 200, the projection module 10D and the receiving module 20D are integrally mounted on the electronic device mainboard 200. It can be understood that the dimension of the projection module 10D in the height direction is smaller than the height dimension of the receiving module 20D, wherein the projection module 10D is stacked on the circuit board transmitting end 232D of the receiving module 20D, thereby the upper end position of the projection module 10D is raised so that the overall height of the projection module 10D and the receiving module 20D of the TOF camera module 300 are close to each other. Preferably, the tops of the projection module 10D and the receiving module 20D are at the same level of height, which is advantageous to improve the photographing quality of the TOF camera module 300D.

It is different from the above first preferred embodiment in that the projection module 10D includes a support 11D, a transmitting circuit board 12D, at least one optical element 13D, at least one projection unit 14D, at least one driver chip 15, and at least one electronic element 17D, wherein the projection unit 14D and the driver chip 15D are disposed on the same side of the transmitting circuit board 12D. The support 11D is disposed on the transmitting circuit board 12D, wherein the optical element 13D is attached above the support 11D and is located in a projection path of the projection module 10D, and by means of the optical element 13D, the light signal projected by the projection unit 14D is diffracted (or expanded, shaped, etc.). The support 11D, the transmitting circuit board 12D and the optical element 13D of the projection module 10D are sealed to form an accommodating space 101D, wherein the projection unit 14D and the driver chip 15D are built in the closed space 101D.

As shown in FIG. 8, the receiving module 20D of the TOF camera module 300D further includes a receiving end connector 24D, wherein one end of the receiving end connector 24D is electrically connected to the receiving circuit board 23D of the receiving module 20D, and by means of the receiving end connector 24D, the receiving circuit board 23D of the receiving module 20D is conductively connected to the electronic device mainboard 200.

As shown in FIG. 9A, the projection module 10D is conductively connected to the receiving circuit board 23D of the receiving module 20D in a flexible board connection manner. The TOF camera module 300D further includes a flexible board 103D, wherein the flexible board 103D conductively connects the transmitting circuit board 12D of the projection module 10D to the receiving circuit board 23D of the receiving module 20D. It can be understood that the flexible board 103D is a flexible circuit board, wherein the flexible board 103D can be turned over so as to electrically connect the transmitting circuit board 12D stacked above the receiving module 20D to the circuit board transmitting end 232D of the receiving circuit board 23D.

The TOF camera module 300D further includes a base support 30D, wherein the base support 30D is disposed on the circuit board transmitting end 232D of the receiving circuit board 23D, and by means of the base support 30D, the height of the projection module 10D is raised so that the height of the projection module 10D is similar to or parallel to the height of the receiving module 20D. Correspondingly, the base support 30D is padded below the transmitting circuit board 12D of the projection module 10D, and the projection module 10D is supported by means of the base support 30D. The transmitting circuit board 12D of the projection module 10D is attached to the upper surface of the base support 30D, and the projection module 10D is fixedly stacked by the base support 30D on the circuit board transmitting end 232D of the receiving circuit board 23D.

In this preferred embodiment of the present invention, the base support 30D is integrally formed on the circuit board transmitting end 232D of the receiving circuit board 23D by a molding process or a sintering process. Preferably, the base support 30D is implemented as a molded base, wherein the base support 30D is disposed below the transmitting circuit board 12D in a heat conduction manner, and the heat generated by the radiating circuit board 12D is conducted by means of the base support 30D.

The TOF camera module 300D further includes at least one electronic element unit 40D, wherein the electronic element unit 40D is disposed on the receiving circuit board 23D, which is used to support the work of the projection module 10D or the receiving module 20D of the TOF camera module 300D. Preferably, the electronic element unit 40D is conductively disposed on the circuit board transmitting end 232D of the receiving circuit board 23D. The electronic element unit 40D is covered by the base support 30D, and the electronic element unit 40D is protected by means of the base support 30D.

The TOF camera module 300D further includes at least one shielding cover 50D, wherein the shielding cover 50D is disposed on the projection module 10D, and by means of the shielding cover 50D, a radio frequency signal generated by the projection module 10D is shielded, thereby preventing the radio frequency signal generated by the projection module 10D from affecting the terminal device.

Preferably, the shielding cover 50D is a metal cover, wherein the shielding cover 50D encloses the projection module 10D outside. It is worth mentioning that when the support 11D of the projection module 10D is made of a material without shielding function such as plastic or ceramic, the shielding cover 50D shields the radio frequency generated by the projection unit 14D from affecting other electronic components.

It is worth mentioning that, in this preferred embodiment of the present invention, the electronic element unit 40D includes but is not limited to capacitors, resistors, inductors, etc. The electronic element unit 40D can reduce the parasitic inductance between the driver chip and the projection module, so as to ensure the waveform integrity of the light signal emitted by the projection module. It can be understood that, although the electronic element unit 40D can improve the pulse waveform of the light signal projected by the projection unit 14D, the electronic element unit 40D can be attached to the electronic device mainboard 200 of the electronic device, the receiving circuit board 23D of the receiving module 20D or/and the transmitting circuit board 12D of the projection module 10D according to design requirements. Therefore, in the preferred embodiment of the present invention, the installation position of the electronic element unit 40D is merely used here as an example, rather than a limitation.

FIG. 9B shows another optional implementation of the TOF camera module 300D of the electronic device according to the above preferred embodiment of the present invention. It is different from the above optional preferred embodiment in that a base support 30E of the TOF camera module 300D is disposed on the projection module 10D and the receiving circuit boards 23D of the receiving module 20D in a bonding manner, to raise the height of the projection module 10D, so that the projection module 10D and the receiving module 20D have similar heights.

In this optional embodiment of the present invention, the base support 30E is integrally formed by a molding process or a sintering process, wherein the base support 30E includes a base support body 31E, and is further provided with a support upper end surface 32E and a support lower end surface 33E, and wherein the support lower end surface 33E is attached to the upper surface of the receiving circuit board 23D. The transmitting circuit board 12D of the projection module 10D is disposed on the support upper end surface 32E of the base support 30E, and by means of the base support body 31E, the height position of the projection module 10D is supported and raised. Preferably, in this preferred embodiment of the present invention, the base support 30E is a one-piece ceramic support. The transmitting circuit board 12D of the projection module 10D is attached to the base support 30E in a heat conduction manner, wherein the transmitting circuit board 12D conducts the heat generated by the work of the projection module 10D to the base support 30E, for the base support 30E to dissipate heat.

The base support 30E is further provided with an accommodating groove 34E, wherein the accommodating groove 34E is formed at the lower end of the base support body 31E, wherein the electronic element unit 40D is shielded by the base support body 31E of the base support 30E on the accommodating groove 34E. When the base support 30E is attached to the receiving circuit board 23D of the receiving module 20D, the circuit board transmitting end 232D of the receiving circuit board 23D and the base support 30E seal the accommodating groove 34E of the base support 30E, wherein the electronic element unit 40D is sealed in the accommodating groove 34E.

FIG. 9C shows another optional implementation of the TOF camera module 300D of the electronic device according to the above preferred embodiment of the present invention. It is different from the above preferred embodiment in that the projection module 10D is conductively connected to the receiving module 20D in a solder joint connection manner.

The TOF camera module 300D further includes a base support 30F, wherein the base support 30F is disposed on the circuit board transmitting end 232D of the receiving circuit board 23D, and by means of the base support 30F, the height of the projection module 10D is raised so that the height of the projection module 10D is similar to or parallel to the height of the receiving module 20D. Correspondingly, the base support 30F is padded below the transmitting circuit board 12D of the projection module 10D, and the projection module 10D is supported by means of the base support 30F. The transmitting circuit board 12D of the projection module 10D is attached to the upper surface of the base support 30F, and the projection module 10D is fixedly stacked by the base support 30F on the circuit board transmitting end 232D of the receiving circuit board 23D. The base support 30F conductively connects the transmitting circuit board 12D of the projection module 10D to the receiving circuit board 23D of the receiving module 20D.

Correspondingly, the base support 30F includes a base support body 31F, and at least one support conduction circuit 35F disposed on the base support body 31F. The support conduction circuit 35F is built into the base support body 31F, wherein one end (upper end) of the support conduction circuit 35F is electrically connected to the transmitting circuit board 12D of the projection module 10D, and the other end (lower end) of the support conduction circuit 35F is electrically connected to the receiving circuit board 23D of the receiving module 20D. In short, the base support 30F conductively connects the transmitting circuit board 12D to the circuit board transmitting end 232D of the receiving circuit board 23D. Preferably, in this preferred embodiment of the present invention, the transmitting circuit board 12D of the projection module 10D is a solder joint conductive connection structure, that is, the lower end of the transmitting circuit board 12D of the projection module 10D is conductively connected to the support conduction circuit 35F of the base support 30F through solder joints.

In this preferred embodiment of the present invention, the base support 30D is integrally formed on the circuit board transmitting end 232D of the receiving circuit board 23D by a molding process or a sintering process. Preferably, the base support 30D is implemented as a ceramic base. The transmitting circuit board 12D of the projection module 10D is attached to the base support 30F in a head conduction manner, wherein the transmitting circuit board 12D conducts the heat generated by the work of the projection module 10D to the base support 30F, for the base support 30F to dissipate heat.

FIG. 9D shows another optional implementation of the TOF camera module 300D of the electronic device according to the above preferred embodiment of the present invention. It is different from the above preferred embodiment in that a transmitting circuit board 12G of the projection module 10D of the TOF camera module is integrally molded on the transmitting circuit board 23D of the receiving module 20D. The transmitting circuit board 12G is conductively disposed on the receiving circuit board 23D, and the overall height of the projection unit 14D, the driver chip 15D and the support 11D of the projection module 10D is raised by means of the transmitting circuit board 12G.

Preferably, in this preferred embodiment of the present invention, the transmitting circuit board 12G is an integrated ceramic circuit board formed by ceramic sintering, wherein the ceramic circuit board has good thermal conductivity, which is advantageous to improve the heat dissipation of projection module 10. It can be understood that, the material of the transmitting circuit board 12G is merely used here as an example, rather than a limitation. Therefore, the transmitting circuit board 12G may also be implemented as other types of circuit board types, such as a one-piece molded circuit board.

In detail, the transmitting circuit board 12G includes a transmitting circuit substrate 120G, and a plurality of upper solder joints 123G, a plurality of lower solder joints 124G and at least one conduction circuit 125G disposed on the transmitting circuit substrate 120G, wherein the upper solder joints 123G are disposed on the upper end of the transmitting circuit substrate 120G, at least one of the upper solder joints 123G is used to be conductively connected to the projection unit 14D of the projection module 10D, at least one of the upper solder joints 123G is used to be conductively connected to the driver chip 15D of the projection module 10D, and at least one of the upper soldered joints 123G is used to be conductively connected to the electronic elements 17D of the projection module 10D. It is the same as the above first preferred embodiment that, the upper solder joints 123G are electrically connected to the lower solder joints 124G through the conduction circuit 125G, and the upper solder joint 123G corresponding to the driver chip 15D is electrically connected to the at least one upper solder joints 123G through the at least one conduction circuit 125G, wherein the upper solder joint 123G is electrically connected to one electrode of the projection unit 14D, so that the projection unit 14D is conductively connected to the driver chip 15D. Preferably, the conduction circuit connecting the driver chip 15D and the projection unit 14D is arranged on the upper surface layer of the transmitting circuit substrate 120G.

In this preferred embodiment of the present invention, the conduction circuit 125G, the upper solder joints 123G and the lower solder joints 124G are integrally disposed on the transmitting circuit substrate 120G, or when the conduction circuit 125G, the upper solder joints 123G and the lower solder joints 124G are preset, the transmitting circuit substrate 120G is integrally formed in a manner of sintering or molding. The upper solder joints 123G are embedded in the upper end surface of the transmitting circuit substrate 120G, and the lower solder joints 124G are embedded in the lower end surface of the transmitting circuit substrate 120G, wherein the conduction circuit 125G is built (wrapped) in the transmitting circuit substrate 120G. In this preferred embodiment of the present invention, the transmitting circuit substrate 120G of the transmitting circuit board 12G is preset with the conduction circuit 125G, the upper solder joints 123G and the lower solder joints 124G before the sintering or molding process, so as to ensure that the projection unit 14D, the driver chip 15D and the electronic elements 17D electrically connected to the upper solder joints 123G can be conducted.

It is worth mentioning that the transmitting circuit board 12G of the projection module 10D of this preferred embodiment of the present invention is integrally molded on the receiving circuit board 23D, wherein the lower solder joints 124G are disposed to be electrically connected to the receiving circuit board 23D. It can be easily conceivable for those skilled in the art that the projection module 10D may also be conductively disposed on the receiving circuit board 23D of the receiving module 20D in other manners, such as a flexible board connection manner. As an example, the transmitting circuit board 12G of the projection module 10D is integrally molded on a flexible board, and by means of the flexible board, the projection module 10D is conductively connected to the receiving circuit board 23D of the receiving module 20D. It can be understood that, in this optional embodiment of the present invention, the projection module 10D may also be conductively attached to the receiving circuit board 23D of the receiving module 20D in a bonding manner. For example, the molded projection module 10D is attached to the receiving circuit board 23D of the receiving module 20D through conductive silver glue.

Figure 10A:
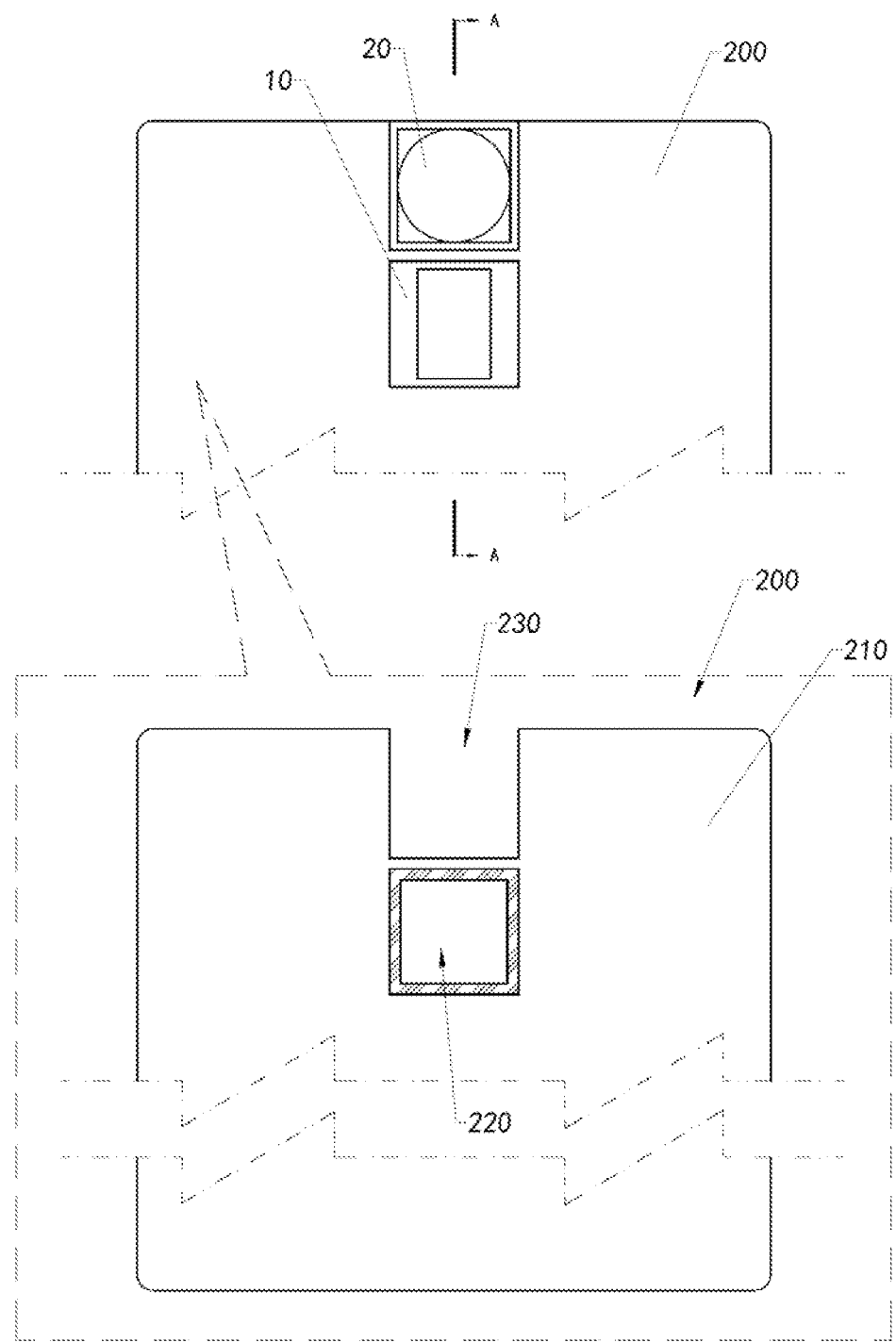
FIG. 10A is a schematic view of the installation of the TOF camera module of the electronic device according to the above preferred embodiment of the present invention.

Referring to FIGS. 10A to 10O of the drawings of the present invention, the TOF camera module 300 of the electronic device according to the above preferred embodiment of the present invention is mounted to an optional implementation of the electronic device motherboard 200. In this optional implementation, the projection module 10 and the receiving module 20 of the TOF camera module 300 are independently mounted to the electronic device mainboard 200. It can be understood by those skilled in the art that the electronic device mainboard 200 of the electronic device may be but not limited to a circuit board, wherein the projection module 10 and the receiving module 20 of the TOF camera module 300 are independently conductively disposed on the electronic device mainboard 200. It is worth mentioning that the TOF camera module 300 can be disposed on the front or back surface of the electronic device mainboard 200. In other words, when the TOF camera module 300 is disposed on the front surface of the electronic device mainboard 200, the TOF camera module is implemented as a front camera apparatus of the electronic device; and when the TOF camera module 300 is disposed on the back surface of the electronic device mainboard 200, the TOF camera module is implemented as a rear camera apparatus of the electronic device. It can be understood that, the position of the TOF camera module is merely used here as an example, rather than a limitation.

Figure 10B:
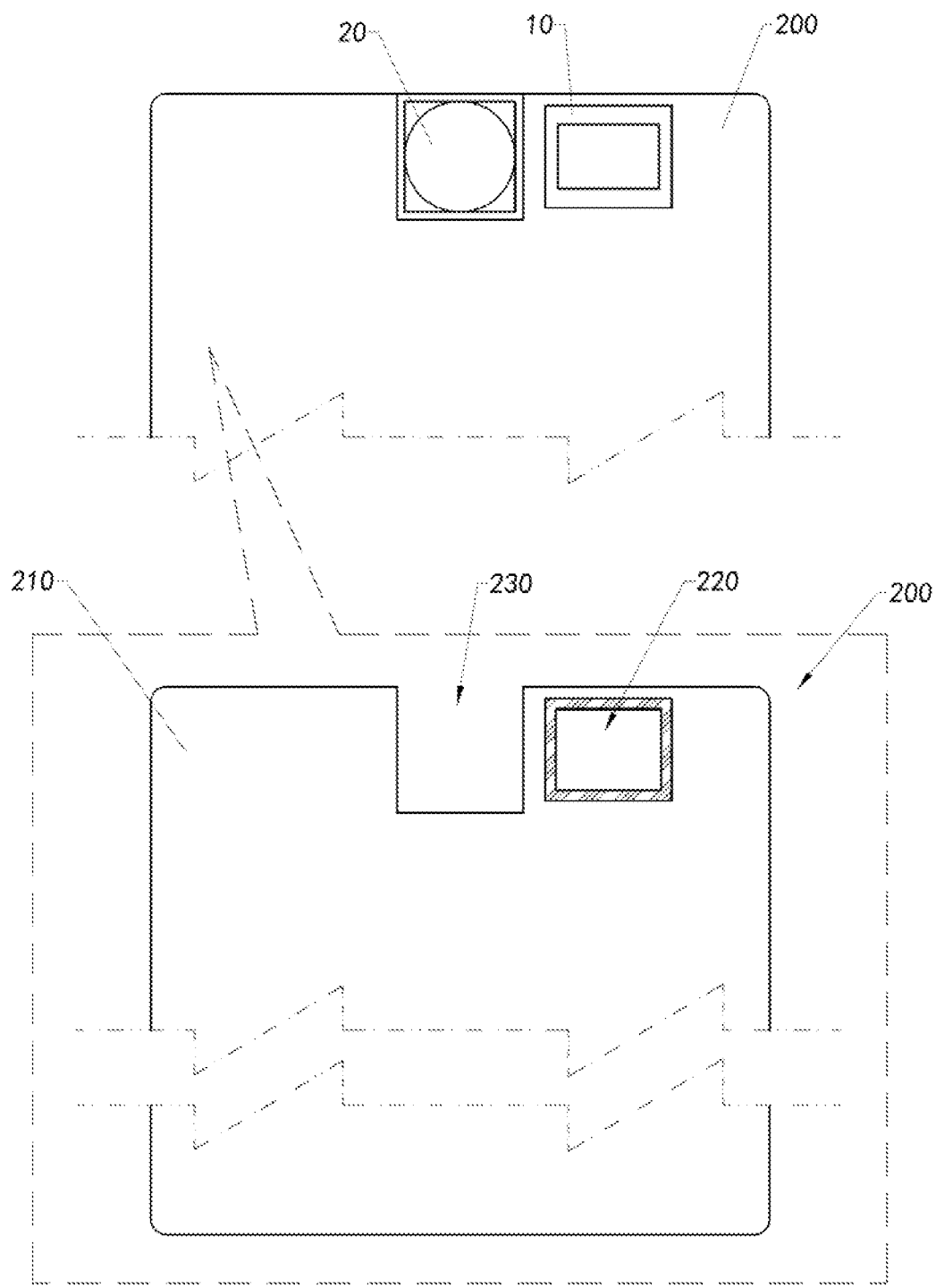
FIG. 10B is a schematic cross-sectional view of the installation of the TOF camera module of the electronic device according to the above preferred embodiment of the present invention.
Figure 10C:
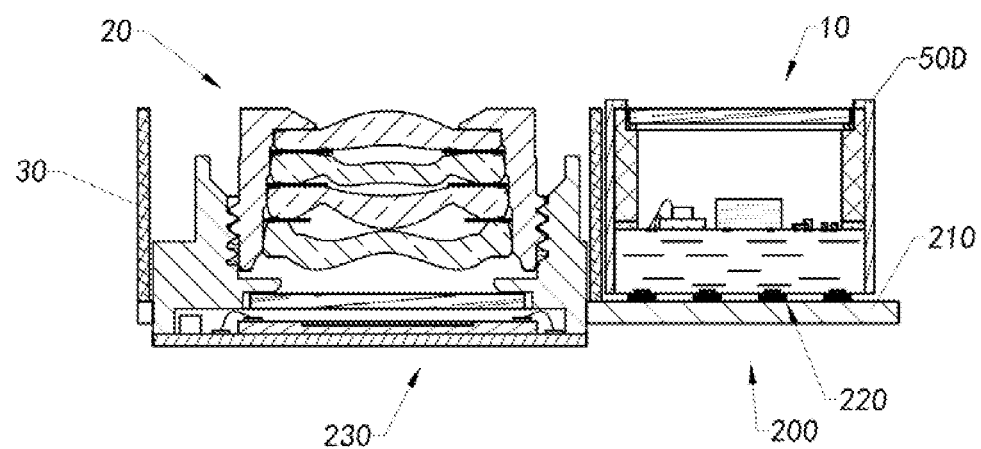
FIG. 10C is a schematic cross-sectional view of the installation of the TOF camera module of the electronic device according to the above preferred embodiment of the present invention.

As shown in FIGS. 10A and 10B, the electronic device mainboard 200 includes a mainboard body 210, and a pad area 220 and a receiving end mounting groove 230 disposed on the mainboard body 210, wherein the pad area 220 is formed on a front or back surface of the mainboard body 210, and the receiving end mounting groove 230 is formed on one end of the mainboard body 210, such as the top end of the mainboard body 210. The projection module 10 of the TOF camera module 300 is conductively disposed in the pad area 220, wherein the transmitting circuit board 12 of the projection module 10 can be electrically connected to the mainboard body 210 of the electronic device mainboard 200 in a solder joint or flexible pad connection manner. Preferably, in this preferred embodiment of the present invention, the transmitting circuit board 12 of the projection module 10 is disposed on the pad area 220 in such a manner that the solder joints are conductive.

The fixing frame 30 of the TOF camera module 300 is fixed on the mainboard body 210 of the electronic device mainboard 200, and the receiving module 20 of the TOF camera module 300 is fixed and supported by means of the fixing frame 30. When the projection module 10 of the TOF camera module 300 is fixedly mounted on the mainboard body 210, the receiving module 20 can be adjusted based on the fixing frame 30, so that the projection optical axis of the projection module 10 of the TOF camera module 300 is adapted to the receiving optical axis of the receiving module 20. In short, after the TOF camera module 300 is fixed on the electronic device mainboard 200, the position of the receiving module 20 in the fixing frame 30 can be adjusted, to adjust the receiving module 20 to adapt to the projection module 10.

The receiving module 20 of the TOF camera module 300 is embedded in the receiving end mounting groove 230, wherein the receiving module 20 is conductively connected to the mainboard body 210. It can be understood that the receiving module 20 is depressed and mounted to the receiving end mounting groove 230 based on a surface (front or back surface) of the mainboard body 210 of the electronic device mainboard 200, to reduce the height difference between the upper end surface of the receiving module 20 and the upper end of the projection module 10. It can be understood that, the receiving module 20 of the TOF camera module 300 is mounted to the receiving end mounting groove 230, which is advantageous to reduce the overall thickness of the electronic device, and is advantageous to the lightening and thinning of the electronic device.

It should be understood by those skilled in the art that the electronic device mainboard 200 may further include a fixing mechanism for fixing the receiving module 20. When the receiving module 20 is mounted to the receiving end mounting groove 230 of the electronic device mainboard 200, the fixing mechanism fixes the receiving module 20 to the mainboard body 210 of the electronic device mainboard 200.

FIGS. 10A and 10B show two different installation manners of the TOF camera module 300, that is, the pad area 220 of the electronic device mainboard 200 may be disposed at a side (lower, right or left side) of the receiving end mounting groove 230. Therefore, when the projection module 10 and the receiving module 20 of the TOF camera module 300 are each independently mounted on the electronic device mainboard 200, the projection module 10 and the receiving module 20 may have various arrangments.

Figure 11A:
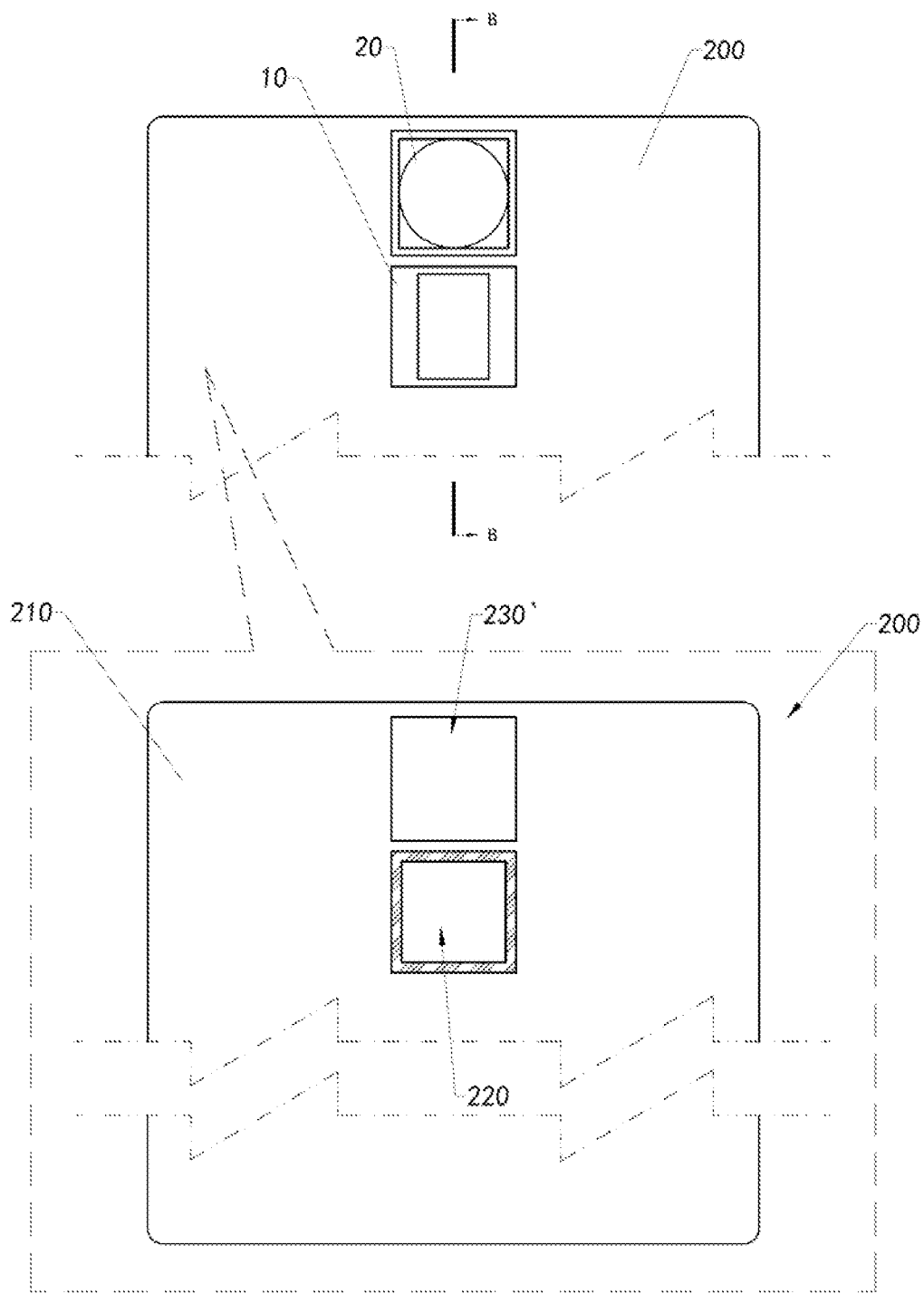
FIG. 11A is a schematic view of the installation of the TOF camera module of the electronic device according to the above preferred embodiment of the present invention.
Figure 11B:
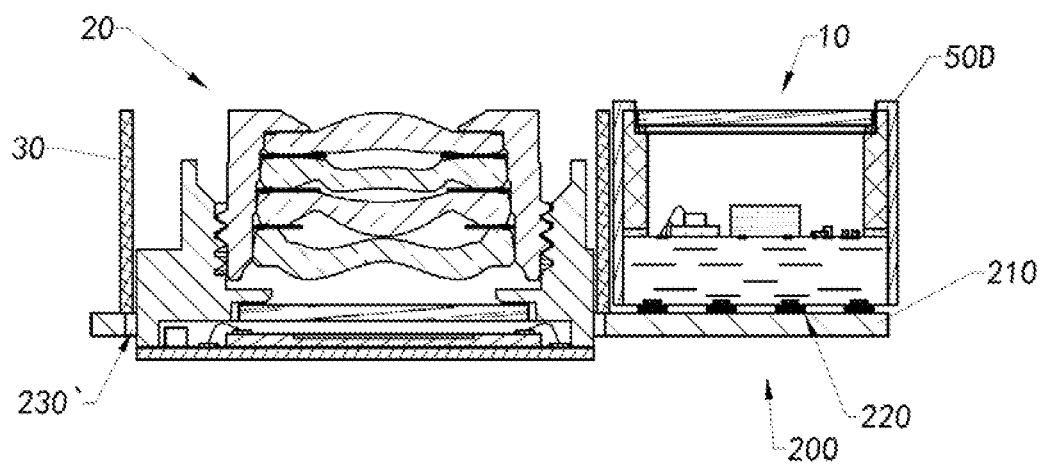
FIG. 11B is a schematic cross-sectional view of the installation of the TOF camera module of the electronic device according to the above preferred embodiment of the present invention.
Figure 11C:
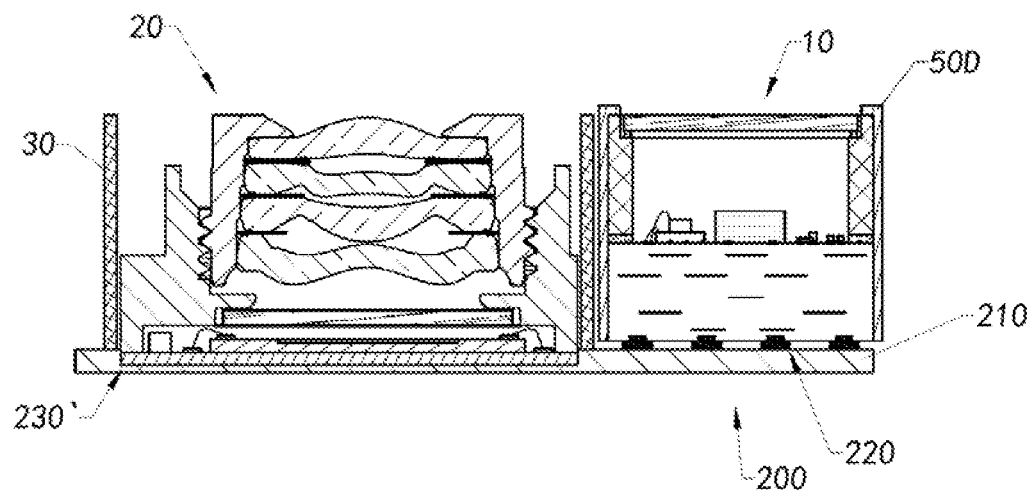
FIG. 11C is a schematic cross-sectional view of the installation of the TOF camera module of the electronic device according to the above preferred embodiment of the present invention.

Referring to FIGS. 11A to 11C of the drawings of the present invention, the TOF camera module 300 of the electronic device according to the above preferred embodiment of the present invention is mounted to an optional implementation of the electronic device motherboard 200. In this optional implementation, the projection module 10 and the receiving module 20 of the TOF camera module 300 are independently mounted to the electronic device mainboard 200. As shown in FIG. 11A, the electronic device mainboard 200 includes a mainboard body 210, and a pad area 220 and a receiving end mounting hole 230' disposed on the mainboard body 210, wherein the pad area 220 is formed on the front or back surface of the mainboard body 210, and the receiving end mounting hole 230' is formed on one end of the mainboard body 210, such as the top end of the mainboard body 210. The projection module 10 of the TOF camera module is conductively disposed in the pad area 220, wherein the transmitting circuit board 12 of the projection module 10 can be electrically connected to the mainboard body 210 of the electronic device mainboard 200 in a solder joint or flexible pad connection manner.

As shown in FIGS. 11B and 11C, it is different from the above preferred embodiment in that, in this preferred embodiment of the present invention, the receiving end mounting hole 230' is a through hole or a semi-permeable hole formed in the mainboard body 210. The receiving module 20 of the TOF camera module 300 is embedded in the receiving end mounting hole 230', wherein the receiving module 20 is conductively connected to the mainboard body 210. It can be understood that the receiving module 20 is depressed and mounted to the receiving end mounting hole 230' based on a surface (front or back surface) of the mainboard body 210 of the electronic device mainboard 200, so as to reduce the height difference between the upper end surface of the receiving module 20 and the upper end of the projection module 10.

It is worth mentioning that, in this preferred embodiment of the present invention, the projection module 10 of the TOF camera module 300 can raise the position of the projection module 10 through a support with a communication/connection circuit, so that the projection module 10 and the receiving module 20 are similar in height. In other words, in the preferred embodiment of the present invention, the projection module 10 of the TOF camera module 300 is electrically connected to the mainboard main body 210 from the pad area 220 of the electronic device mainboard 200 in a raised manner.

Figure 12A:
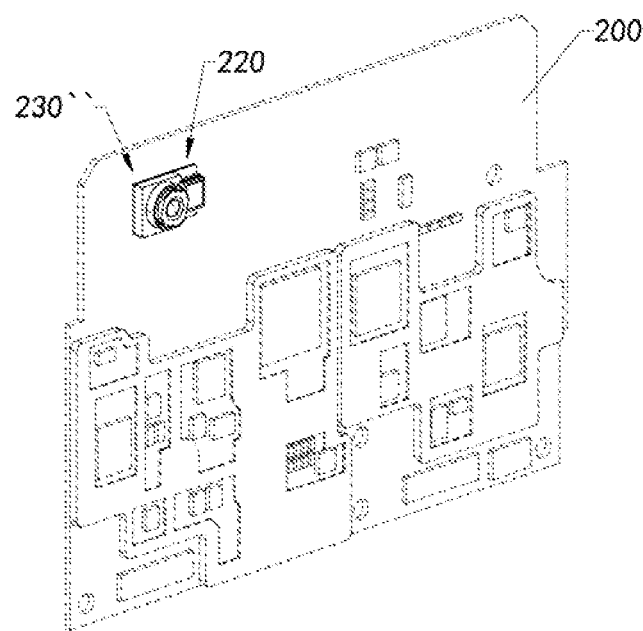
FIG. 12A is a schematic view of the installation of a TOF camera module of the electronic device according to the above preferred embodiment of the present invention.
Figure 12B:
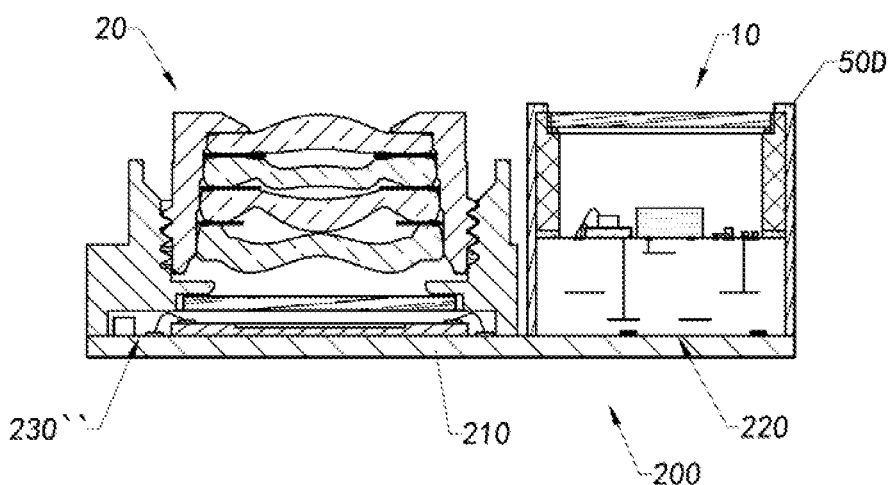
FIG. 12B is a schematic cross-sectional view of the installation of the TOF camera module of the electronic device according to the above preferred embodiment of the present invention.
Figure 13:
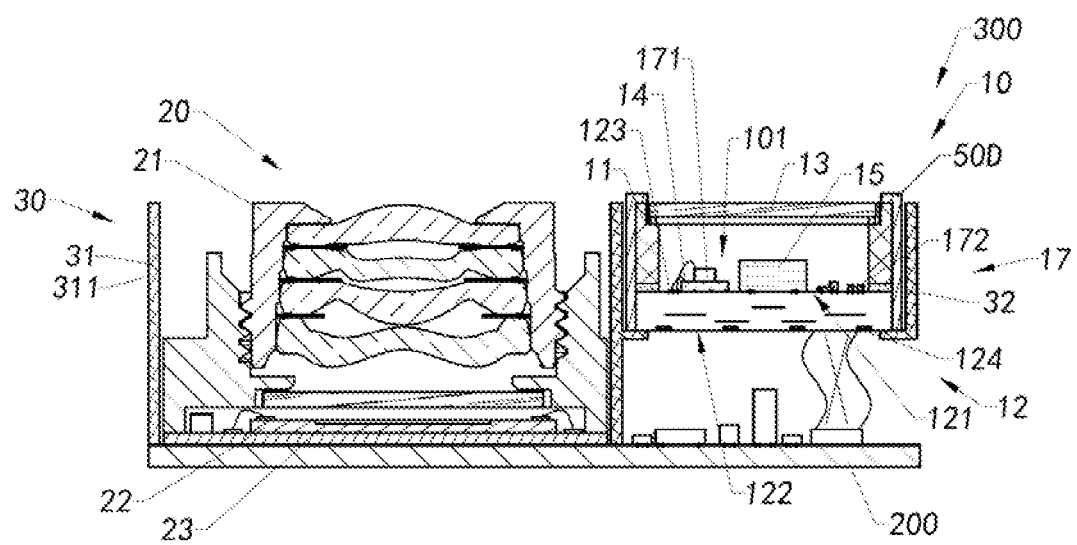
FIG. 13 is a schematic cross-sectional view of the installation of the TOF camera module of the electronic device according to the above preferred embodiment of the present invention.

Referring to FIGS. 12A to 13 of the drawings of the present invention, the TOF camera module 300 of the electronic device according to the above preferred embodiment of the present invention is mounted to another optional implementation of the electronic device motherboard 200. It is different from the above preferred embodiment in that, in this optional implementation, the TOF camera module 300 assembled into one body is mounted on the electronic device mainboard 200. As shown in FIG. 12A, the electronic device mainboard 200 includes a mainboard body 210, and a pad area 220 and a receiving end mounting area 230" disposed on the mainboard body 210, wherein the pad area 220 is formed on the front or back surface of the mainboard body 210, and the receiving end mounting area 230" is formed on one end of the mainboard body 210, such as the top end of the mainboard body 210. The projection module 10 of the TOF camera module is conductively disposed in the pad area 220, wherein the transmitting circuit board 12 of the projection module 10 can be electrically connected to the mainboard body 210 of the electronic device mainboard 200 in a solder joint or flexible pad connection manner.

Preferably, the projection module 10 and the receiving module 20 of the TOF camera module 300 are attached to the mainboard body 210 of the electronic device mainboard 200, wherein the pad area 220 and the receiving end mounting area 230" are mounting areas formed on a surface of the mainboard body 210. It can be understood that, in other embodiments of the present invention, the pad area 220 and the receiving end mounting area 230" are holes, grooves, half holes, etc. formed in the mainboard body 210. That is to say, the projection module 10 and the receiving module 20 of the TOF camera module 300 can be depressed and mounted to the pad area 220 and the receiving end mounting area 230" from one surface (front or back surface) of the mainboard body 210 of the electronic device mainboard 200, so as to reduce the overall thickness of the electronic device. It can be understood that the electronic device mainboard 200 may also include a fixed mounting mechanism for fixedly mounting the TOF camera module 300, and by means of the fixed mounting mechanism, the TOF camera module 300 is fixedly mounted to the electronic device mainboard 200.

As shown in FIG. 13, it is different from the above preferred embodiment in that the projection module 10 and the receiving module 20 of the TOF camera module 300 are separately disposed on the fixing frame 30, and the projection module 10 and the receiving module 20 are fixed to the electronic device motherboard 200 by means of the fixing frame 30. In this preferred embodiment of the present invention, the receiving module 20 is adjustably disposed on the receiving end fix holder 31 of the fixing frame 30, and the transmitting end fix holder 32 of the fixing frame 30 is used to raise the height position of the projection module 10.

It is worth mentioning that the projection module 10 and the receiving module 20 are separately fixed to the fixing frame 30, and the projection module 10 and the receiving module 20 are fixed and supported by means of the fixing frame 30. In this preferred embodiment of the present invention, the projection module 10 is supported by the transmitting end fix holder 32 of the fixing frame 30 to be raised, wherein the bottom of the projection module 10 is raised by the transmitting end fix holder 32, so that the upper plane of the projection module 10 is flush with or substantially parallel to the receiving module 20. It can be understood that, the projection module 10 is raised by the fixing frame 30, and an avoidance space is formed below the projection module 10, wherein the avoidance space can be used to mount or accommodate other electronic elements, wherein the electronic elements may be electronic components sustaining the TOF camera module 300, or may be implemented as other electronic components of the electronic device. In short, in this preferred embodiment of the present invention, the projection module 10 is mounted above the electronic device mainboard 200 in such a manner that it is raised by the fixing frame 30, and thus the projection module 10 is raised up, while an avoidance space for mounting other electronic elements is formed between the electronic device mainboard 200 and it, forming a space overlap, which is advantageous to improve the space utilization rate.

It can be understood that the fixing frame 30 raises the projection module 10 so that the projection module 10 is stacked above the electronic device mainboard 200 to improve the space utilization rate.

It is worth mentioning that, in this preferred embodiment of the present invention, the fixing frame 30 supports the projection module 10, wherein when the fixing frame 30 is a support made of metal, the fixing frame 30 shields the radio frequency signal generated by the projection module 10, that is, the fixing frame 30 made of metal can be used as a shielding cover to shield the interference signal generated by the projection module 10. If the fixing frame is made of plastic material, at least one shielding cover 50D is disposed outside the projection module 10, so as to shield the radio frequency signal generated by the projection module 10 by the shielding cover.

It should be understood by those skilled in the art that the embodiments of the present invention shown in the above description and the drawings are only used as examples and do not limit the present invention. The objectives of the present invention have been fully and effectively achieved. The functional and structural principles of the present invention have been shown and described in the embodiments, and the implementations of the present invention may be changed or modified in any way without departing from the principles.

The invention claimed is:

1. A projection module, comprising:
a transmitting circuit board;
a frame-shaped support, wherein the support is disposed on the transmitting circuit board and has an opening at its top surface;
an optical element, wherein the optical element is attached to the opening of the support, and an accommodating space is formed above the transmitting circuit board by means of the optical element and the support;
at least one projection unit, wherein the projection unit is disposed in the accommodating space, and the projection unit is conductively attached to the transmitting circuit board; and
at least one driver chip, wherein the driver chip is packaged into the accommodating space, the driver chip is conductively connected to the transmitting circuit board, the driver chip is on the same side as the projection unit, and the driving chip sends a light control signal to the projection unit based on the transmitting circuit board;
wherein the transmitting circuit board has an upper end surface and a lower end surface, wherein the driver chip is attached to the upper end surface of the transmitting circuit board in a manner adjacent to the projection unit; and
the transmitting circuit board comprises:
a transmitting circuit substrate;
a plurality of upper solder joints, wherein the upper solder joints are disposed on an upper end of the transmitting circuit substrate;
a plurality of lower solder joints, wherein the lower solder joints are disposed on a lower end of the transmitting circuit substrate; and
a plurality of conduction circuits, wherein the conduction circuits electrically connect the upper solder joints and the lower solder joints, and wherein the driver chip is conductively connected to the conduction circuits through the upper solder joints, and the lower solder joints are electrically connected to the upper solder joints through the conduction circuits.

2. The projection module according to claim 1, wherein the projection module further comprises a connection layer, and the support is connected to the upper end surface of the transmitting circuit board by means of the connection layer.

3. The projection module according to claim 2, wherein the connection layer is selected from a group consisting of an adhesive layer and a solder layer.

4. The projection module according to claim 2, wherein the support contacts the driver chip in a thermally conductive manner, and heat generated by the driver chip is conducted by means of the support.

5. The projection module according to claim 4, wherein the support has an accommodating cavity, the driver chip is disposed in the accommodating cavity, and the support covers the upper surface of the driver chip in a thermal contact manner.

6. The projection module according to claim 4, wherein the support is selected from a group consisting of a ceramic sintered support and a molded support.

7. The projection module according to claim 1, wherein the support is integrally formed on the upper end surface of the transmitting circuit board through a molding process.

8. The projection module according to claim 7, wherein the driver chip is covered by the support, and heat generated by the driver chip is conducted by means of the support.

9. The projection module according to claim 1, wherein the projection module further comprises a flexible board and a connector, wherein the lower solder joints of the transmitting circuit board are conductively connected to the flexible board, and the flexible board is conductively connected to the connector through the flexible board.

10. The projection module according to claim 1, wherein the projection module further comprises a flexible board, and wherein one end of the flexible board is conductively connected to the transmitting circuit board.

11. The projection module according to claim 1, wherein the support comprises a support body and is further provided with a mounting groove and at least one air escape groove, wherein the mounting groove is formed at an upper end of the support body, the optical element is disposed in the mounting groove, the air escape groove communicates the accommodating space with an external environment, and air pressure is balanced between the accommodating space and the external environment by means of the air escape groove.

12. The projection module according to claim 1, wherein the support comprises a support body and is further provided with at least one glue painting area, and between the glue painting area and the optical element, a cured glue layer is formed by curing glue, and an air escape gap is formed at an interval, wherein the air escape gap communicates the accommodating space with an external environment, and air pressure is balanced between the accommodating space and the external environment by means of the air escape gap.

13. The projection module according to claim 1, wherein the projection module further comprises at least one electrical element, wherein the electrical element is conductively connected to the transmitting circuit board.

14. The projection module according to claim 13, wherein the electrical element comprises a photodiode for monitoring light changes in the projection module, and the photodiode is conductively connected to the driver chip, for the driver chip to control a working state of the projection unit based on detection information of the photodiode.

15. The projection module according to claim 13, wherein the electrical element comprises a negative temperature coefficient device for monitoring a temperature of the projection unit, and the negative temperature coefficient device is conductively connected to the driver chip through the transmitting circuit board.

16. The projection module according to claim 1, wherein the transmitting circuit substrate of the transmitting circuit board is selected from a group consisting of a ceramic substrate and a PCB board.

17. A TOF camera module, comprising:
the projection module according to claim 1, wherein the projection unit of the projection module is controlled by the driver chip to project detection light; and
a receiving module, wherein the receiving module is disposed adjacent to the projection module, and the receiving module receives reflected light of the detection light, and obtains depth information of an illuminated object based on the reflected light.

18. An electronic device, comprising:
an electronic device host;
an electronic device mainboard, wherein the electronic device mainboard is disposed on the electronic device host; and at least one TOF camera module, wherein the TOF camera module is conductively disposed on the electronic equipment mainboard, and the TOF camera module comprises:

the projection module according to claim 1, wherein the projection unit of the projection module is controlled by the driver chip to project detection light; and a receiving module, wherein the receiving module is disposed adjacent to the projection module, and the receiving module receives reflected light of the detection light, and obtains depth information of an illuminated object based on the reflected light.

* * * * *